(12) United States Patent
Inoue

(10) Patent No.: US 11,442,434 B2
(45) Date of Patent: Sep. 13, 2022

(54) PARAMETER DESIGN ASSISTANCE DEVICE AND PARAMETER DESIGN ASSISTANCE METHOD

(71) Applicant: SCREEN Holdings Co., Ltd., Kyoto (JP)

(72) Inventor: Masafumi Inoue, Kyoto (JP)

(73) Assignee: SCREEN Holdings Co., Ltd.

( * ) Notice: Subject to any disclaimer, the term of this patent is extended or adjusted under 35 U.S.C. 154(b) by 204 days.

(21) Appl. No.: 16/626,403

(22) PCT Filed: Jun. 14, 2018

(86) PCT No.: PCT/JP2018/022750
§ 371 (c)(1),
(2) Date: Dec. 24, 2019

(87) PCT Pub. No.: WO2019/021670
PCT Pub. Date: Jan. 31, 2019

(65) Prior Publication Data
US 2020/0142389 A1 May 7, 2020

(30) Foreign Application Priority Data
Jul. 27, 2017 (JP) .............................. JP2017-145667

(51) Int. Cl.
*G05B 19/418* (2006.01)

(52) U.S. Cl.
CPC .................. *G05B 19/41865* (2013.01); *G05B 2219/32097* (2013.01); *G05B 2219/35083* (2013.01); *G05B 2219/45031* (2013.01)

(58) Field of Classification Search
CPC .... G05B 19/41865; G05B 2219/32097; G05B 2219/35083; G05B 2219/45031; G05B 13/024; H01L 21/02
See application file for complete search history.

(56) References Cited

U.S. PATENT DOCUMENTS 9,124,135 B2    9/2015  Abe et al. ......................... 700/8
9,385,012 B2    7/2016  Fujii et al.
(Continued)

FOREIGN PATENT DOCUMENTS

JP    2001-265830 A    9/2001
JP    2003-297892 A    10/2003
(Continued)

OTHER PUBLICATIONS

International Search Report dated Aug. 21, 2018 in corresponding PCT International Application No. PCT/JP2018/022750.
(Continued)

*Primary Examiner* — Charles R Kasenge
(74) *Attorney, Agent, or Firm* — Ostrolenk Faber LLP

(57) ABSTRACT

A parameter design assistance device (2) includes storage (24) and a controller (25). The storage (24) stores therein a recipe for controlling a substrate processing device (81). The controller (25) acquires one or more level values for each of control factors. The level values indicate conditions according to which the substrate processing device (1) is to process a substrate (11). The controller (25) generates, through statistical technique, combination information representing combinations of the level values acquired. The controller (25) creates an evaluation recipe for each of the combinations of the level values based on the combination information and the recipe stored in the storage (24). When the evaluation recipe includes a parameter corresponding to a (Continued)

control factor, the controller (25) sets a corresponding level value for the control factor as a parameter value of the parameter.

26 Claims, 13 Drawing Sheets

(56) References Cited

U.S. PATENT DOCUMENTS

| | | | |
|---|---|---|---|
| 9,389,601 B2 | 7/2016 | Nakamura et al. | 700/90 |
| 9,904,280 B2 | 2/2018 | Sugiyama | |
| 2006/0079983 A1* | 4/2006 | Willis | G05B 17/02 |
| | | | 700/108 |
| 2007/0067056 A1* | 3/2007 | Nishinohara | G05B 19/41885 |
| | | | 700/121 |
| 2007/0078553 A1* | 4/2007 | Miwa | G06F 30/00 |
| | | | 700/97 |
| 2008/0140229 A1* | 6/2008 | Nishinohara | G05B 19/41885 |
| | | | 700/47 |
| 2011/0288691 A1 | 11/2011 | Abe et al. | 700/292 |
| 2014/0121791 A1 | 5/2014 | Nakamura et al. | 700/90 |
| 2014/0197129 A1 | 7/2014 | Fujii et al. | 216/2 |
| 2015/0192921 A1 | 7/2015 | Sugiyama | |
| 2018/0129189 A1 | 5/2018 | Sugiyama | |

FOREIGN PATENT DOCUMENTS

| | | |
|---|---|---|
| JP | 2007-258563 A | 10/2007 |
| JP | 2008-108830 A | 5/2008 |
| JP | 2008-217513 A | 9/2008 |
| JP | 2013-016072 A | 1/2013 |
| JP | 2014-158014 A | 8/2014 |
| JP | 5630537 B2 | 11/2014 |
| TW | 200308034 A | 12/2003 |
| TW | 201417204 A | 5/2014 |
| TW | 201532121 A | 8/2015 |

OTHER PUBLICATIONS

Written Opinion dated Aug. 21, 2018 in corresponding PCT International Application No. PCT/JP2018/022750.

Office Action dated Sep. 9, 2019 in corresponding Taiwanese Patent Application No. 107121313.

* cited by examiner

| Control factor | A | B | C | D | E | F | G | H |
|---|---|---|---|---|---|---|---|---|
| Level 1 | A1 | B1 | C1 | D1 | E1 | F1 | G1 | H1 |
| Level 2 | A2 | B2 | C2 | D2 | E2 | F2 | G2 | H2 |
| Level 3 | – | B3 | C3 | D3 | E3 | F3 | G3 | H3 |
FIG. 9A
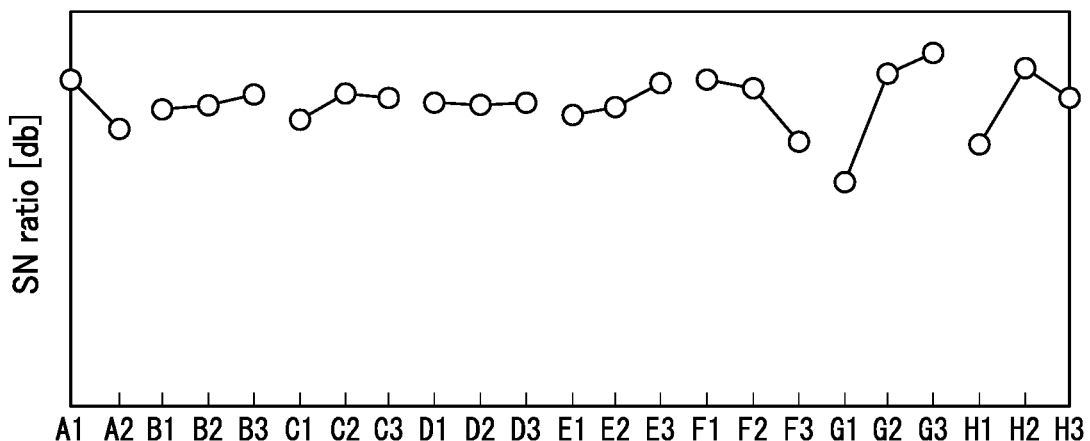
FIG. 9B
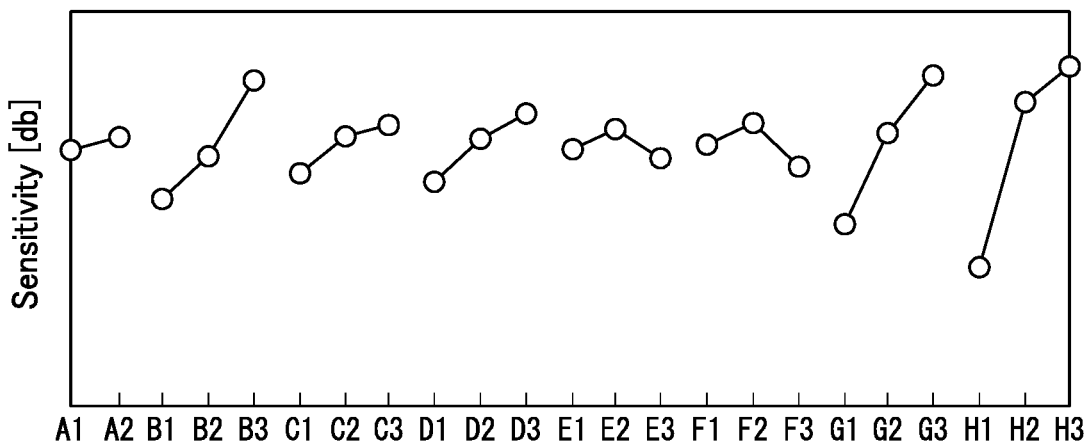
FIG. 9C

| Control factor 121 | Level value range 124 | |
|---|---|---|
| Factor name | Lower limit | Upper limit |
| 1 | | |
| 2 | | |
| 3 | | |
| 4 | | |
| 5 | | |
| 6 | | |
| 7 | | |
| 8 | | |

PARAMETER DESIGN ASSISTANCE DEVICE AND PARAMETER DESIGN ASSISTANCE METHOD

CROSS-REFERENCE TO RELATED APPLICATIONS

The present application is a 35 U.S.C. §§ 371 national phase conversion of PCT/JP2018/022750, filed Jun. 14, 2018, which claims priority to Japanese Patent Application No. 2017-145667, filed Jul. 27, 2017, the contents of both of which are incorporated herein by reference. The PCT International Application was published in the Japanese language.

TECHNICAL FIELD

The present invention relates to a parameter design assistance device and a parameter design assistance method.

BACKGROUND ART

A parameter design for a substrate processing device is performed based on repetition of trial (what is called "setting conditions"). Specifically, robustness parameters are established by processing substrates while changing respective values of various parameters for substrate processing (processing conditions) and then analyzing the results (for example Patent Literature 1). The parameter design for the substrate processing device is performed not only during product development, but also when parameter values needs to be changed due to changes with time of components constituting the substrate processing apparatus.

When a parameter design is performed, an orthogonal array is used to reduce the number of experiments (trials) in general. The orthogonal array can easily be created by using dedicated application software.

CITATION LIST

Patent Literature

[Patent Literature 1] JP 2007-258563 A

SUMMARY OF INVENTION

Technical Problem

However, even when the orthogonal array is used, a configuration in which an operator changes (enters) parameter values via an on-screen dialog as described in Patent Literature 1 requires carefully changing the parameter values to avoid typing errors. There is room for further improvement, considering a burden on the operator.

The present invention has been achieved in view of the above circumstances, and an object thereof is to provide a parameter design assistance device and a parameter design assistance method, assisting a parameter design to reduce a burden on an operator.

Solution to Problem

A parameter design assistance device according to an aspect of the present invention includes storage and a controller. The storage stores therein a recipe for controlling a substrate processing device. The controller acquires one or more level values for each of control factors. The level values indicate conditions according to which the substrate processing device is to process a substrate. The controller generates, through statistical technique, combination information representing combinations of the level values acquired. The controller creates an evaluation recipe for each of the combinations of the level values based on the recipe and the combination information. When the evaluation recipes include one or more parameters corresponding to the control factors, the controller sets, as respective parameter values of the one or more parameters, one or more level values for the control factors to which the one or more parameters correspond.

In an embodiment, the statistical technique is a Taguchi method or an experimental design method.

In an embodiment, the controller allocates the level values acquired to an orthogonal array to generate the combination information.

In an embodiment, the parameter design assistance device includes an input section that allows an operator to operate. The input section allows the operator to enter the control factors to be registered therein.

In an embodiment, the controller operates the substrate processing device based on a corresponding evaluation recipe for each of the combinations of the level values.

In an embodiment, the parameter design assistance device includes an input section that allows an operator to operate. The input section allows the operator to enter a selection instruction therein. The selection instruction indicates whether or not to change a mode of the controller from a mode for creating the evaluation recipes to a mode for operating the substrate processing device.

In an embodiment, the control factors include a non-recipe factor that cannot be controlled by a corresponding evaluation recipe. The controller suspends processing performed by the substrate processing device until the non-recipe factor reaches a corresponding level value.

In an embodiment, the parameter design assistance device includes an input section that allows an operator to operate. The input section allows the operator to enter a ready instruction therein. Here, the ready instruction indicates that the non-recipe factor has reached the corresponding level value. The controller causes the substrate processing device to process the substrate after the ready instruction is entered in the input section.

In an embodiment, the control factors include a stand-by factor corresponding to a parameter that needs to wait until a parameter value thereof stabilizes. The controller suspends processing performed by the substrate processing device until the stand-by factor stabilizes at a corresponding level value.

In an embodiment, the controller repeats generation of the combination information and creation of the evaluation recipe. The controller changes one or more level values of at least one of the control factors when second combination information and subsequent respective pieces of combination information are generated.

In an embodiment, the parameter design assistance device includes an input section that allows an operator to operate. The input section allows the operator to enter a level value range to be registered for each of the control factors therein. When acquiring the one or more level values, the controller acquires one or more values included in the level value range. The controller acquires, as the one or more level values of at least one of the control factors, one or more values different from one or more previous values from the level value range when the second combination information and the subsequent respective pieces of combination information are generated.

In an embodiment, the controller calculates, of respective SN ratios and sensitivity values of the level values for the control factors, at least the SN ratios based on an inspection result of the substrate processed by the substrate processing device. The controller determines whether or not the control factors include a control factor whose one or more corresponding SN ratios and/or sensitivity values are out of respective ranges of acceptance/reject criteria. The controller finishes repeating the generation of the combination information and the creation of the evaluation recipe when determining that the control factors include no control factor whose one or more corresponding SN ratios and/or sensitivity values are out of the respective corresponding ranges of acceptance/reject criteria.

In an embodiment, the parameter design assistance device includes an alarm notification section that raises alarm. The alarm notification section raises alarm when the control factors include the control factor whose one or more corresponding SN ratios and/or sensitivity values are out of the respective corresponding ranges of acceptance/reject criteria even if the number of times the generation of the combination information and the creation of the evaluation recipe are repeated reaches a predetermined number of times.

A parameter design assistance method according to an aspect of the present invention includes a combination information generating step and an evaluation recipe creating step. The combination information generating step includes acquiring, by a controller, one or more level values for each of control factors to generate, through statistical technique, combination information representing combinations of the level values acquired. The level values indicate conditions according to which a substrate processing device is to process a substrate. In the evaluation recipe creating step, the controller creates an evaluation recipe for each of the combinations of the level values based on the combination information and a recipe for controlling the substrate processing device. In the evaluation recipe creating step, when the evaluation recipe includes one or more parameters corresponding to the control factors, the controller sets, as respective parameter values of the one or more parameters, one or more level values for the control factors to which the one or more parameters correspond.

In an embodiment, the statistical technique is a Taguchi method or an experimental design method.

In an embodiment, in the combination information generating step, the controller allocates the level values acquired to an orthogonal array to generate the combination information.

In an embodiment, in the combination information generating step, an input section receives the control factors to be registered.

In an embodiment, the parameter design assistance method further includes a processing step. In the processing step, the controller operates the substrate processing device based on a corresponding evaluation recipe for each of the combinations of the level values.

In an embodiment, the parameter design assistance method further includes a step of receiving, by an input section, a selection instruction. The selection instruction indicates whether or not to change a mode of the controller from a mode for creating the evaluation recipes to a mode for operating the substrate processing device.

In an embodiment, the control factors include a non-recipe factor that cannot be controlled by a corresponding evaluation recipe. In the processing step, the controller suspends processing performed by the substrate processing device until the non-recipe factor reaches a corresponding level value.

In an embodiment, the processing step includes a step of receiving, by an input section, a ready instruction. The ready instruction indicates that the non-recipe factor has reached the corresponding level value. The controller causes the substrate processing device to process the substrate after the ready instruction is entered in the input section.

In an embodiment, the control factors include a stand-by factor corresponding to a parameter that needs to wait until a parameter value thereof stabilizes. In the processing step, the controller suspends processing performed by the substrate processing device until the stand-by factor stabilizes at a corresponding level value.

In an embodiment, the combination information generating step and the evaluation recipe creating step are repeated. In a second combination information generating step and subsequent respective combination information generating steps, the controller changes one or more level values of at least one of the control factors.

In an embodiment, in the combination information generating step, an input section receives a level value range for each of the control factors. When acquiring the one or more level values, the controller acquires one or more values included in the level value range. In a second combination information generating step and subsequent respective combination information generating steps, the controller acquires, as the one or more level values of at least one of the control factors, one or more values different from one or more previous values from the level value range.

In an embodiment, the parameter design assistance method further includes a calculating step and a determining step. In the calculating step, the controller calculates, of respective SN ratios and sensitivity values of the level values for the control factors, at least the SN ratios based on an inspection result of the substrate processed by the substrate processing device. In the determining step, the controller determines whether or not the control factors include a control factor whose one or more corresponding SN ratios and/or sensitivity values calculated in the calculating step are out of respective ranges of acceptance/reject criteria. The repetition of the combination information generating step and the evaluation recipe creating step ends when the controller determines that the control factors include no control factor whose one or more corresponding SN ratios and/or sensitivity values are out of the respective ranges of acceptance/reject criteria.

In an embodiment, the parameter design assistance method further includes an alarm notifying step. The alarm notifying step includes raising, by an alarm notification section, alarm when the controller determines that the control factors include the control factor whose one or more corresponding SN ratios and/or sensitivity values are out of the respective ranges of acceptance/reject criteria even if the number of times the combination information generating step and the evaluation recipe creating step are repeated reaches a predetermined number of times.

Advantageous Effects of Invention

The present invention enables reduction in the burden on the operator.

BRIEF DESCRIPTION OF DRAWINGS

FIG. 9A is a table representing an example of a relationship between control factors and level values.

FIG. 9B depicts an example of a graph of factorial effects about SN ratios.

FIG. 9C depicts an example of a graph of factorial effects about sensitivity values.

FIG. 11 illustrates a second on-screen setting in a second embodiment of the present invention.

DESCRIPTION OF EMBODIMENTS

Figure 1:
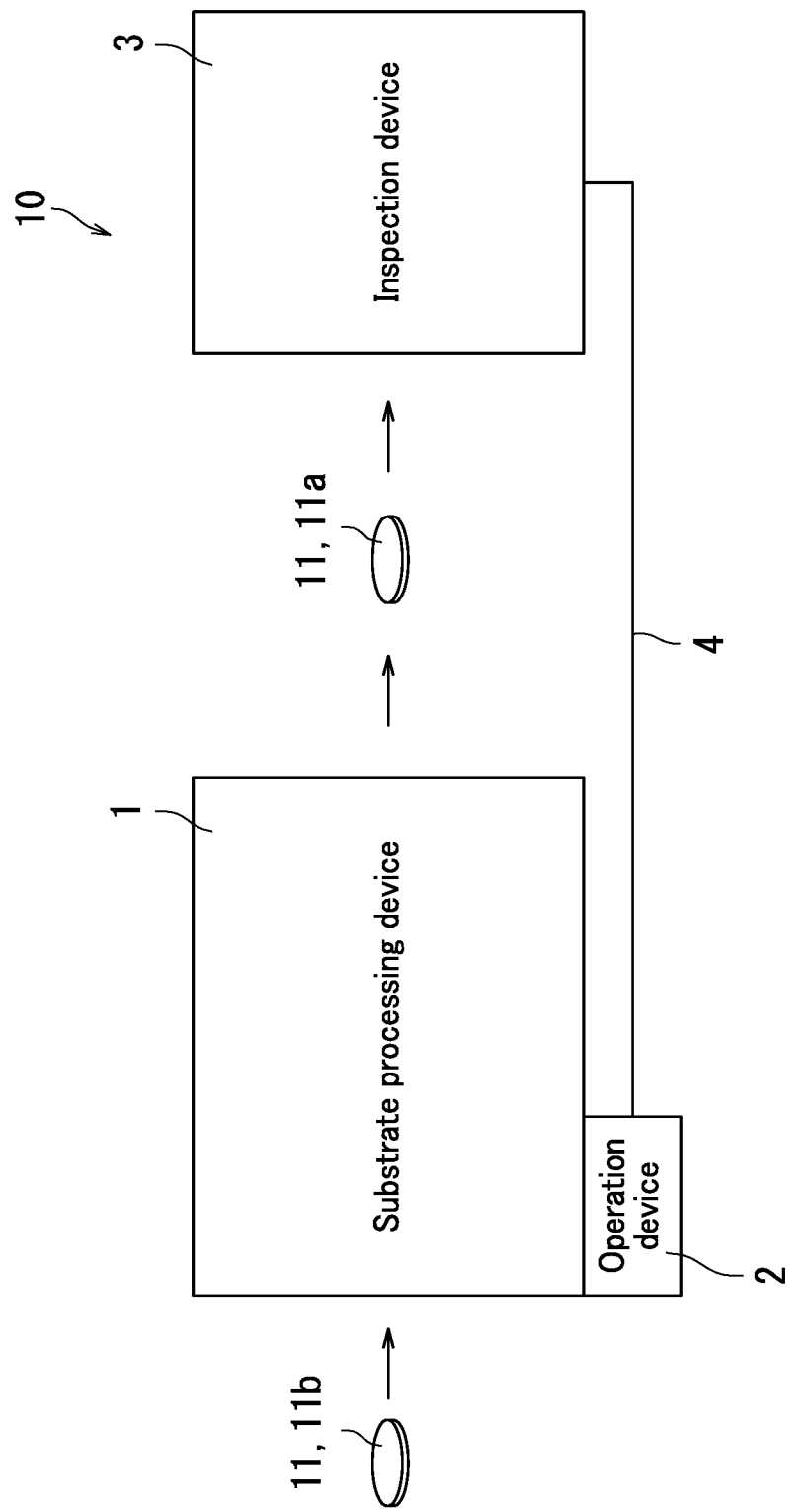
FIG. 1 illustrates a parameter design assistance system according to a first embodiment of the present invention.

Embodiments of the present invention will hereinafter be described with reference to the accompanying drawings. The present invention is however not limited to the embodiments below. Elements that are the same or equivalent are labelled with the same reference signs in the drawings, and description thereof will not be repeated.

First Embodiment

FIG. 1 illustrates a parameter design assistance system 10 according to the present embodiment. As illustrated in FIG. 1, the parameter design assistance system 10 includes a substrate processing device 1, an operation device 2, an inspection device 3, and a communication cable 4.

The substrate processing device 1 is a single wafer processing device that processes a substrate 11 on a sheet-by-sheet basis. Specifically, the substrate processing device 1 processes the substrate 11 by discharging a chemical liquid onto the substrate 11. In the present embodiment, the substrate 11 is a semiconductor wafer.

Processing of the substrate 11 is not limited in particular. For example, the substrate processing device 1 may be a cleaning device that performs cleaning of the substrate 11. Alternatively, the substrate processing device 1 may be an etching device that performs etching of the substrate 11. Specifically, the cleaning device discharges a chemical liquid from a nozzle thereof toward the substrate 11 being rotated in a chamber, thereby cleaning the substrate 11. The etching device discharges a chemical liquid from a nozzle thereof toward the substrate 11 being rotated in a chamber, thereby etching the substrate 11.

The chemical liquid is for example a liquid containing hydrogen fluoride (HF) such as hydrofluoric acid. Note that the chemical liquid is not limited to the liquid containing hydrogen fluoride, but may be a liquid containing at least one of items below. Here, the items include organic acid such as sulfuric acid, acetic acid, nitric acid, hydrochloric acid, ammonia water, hydrogen peroxide water, citric acid, and ethanedioic acid; organic alkali such as tetramethylammonium hydroxide (TMAH); surfactant; and corrosion inhibitor.

The substrate processing device 1 discharges a rinse liquid to the substrate 11, thereby performing rinse processing. The rinse processing is performed after processing by a chemical liquid (hereinafter referred to as "chemical liquid processing"). Specifically, after the chemical liquid processing, a rinse liquid is discharged from the nozzle toward the substrate 11 being rotated in the chamber, thereby replacing the chemical liquid on the substrate 11 with the rinse liquid.

For example, deionized water (DIW), what is called "ultra pure water" is employed as the rinse liquid. Note that the rinse liquid is not limited to the DIW, but may be any of for example items below. Here, the items include carbonated water, electrolytic ionic water, hydrogen water, ozonated water, and dilution concentration (e.g. about 10 ppm to 100 ppm) of ammonia water.

The substrate 11 before predetermined processing is applied thereto by the substrate processing device 1 may hereinafter be referred to as an "unprocessed substrate 11b". The substrate 11 after the predetermined processing is applied thereto by the substrate processing device 1 may be referred to as a "processed substrate 11a".

The operation device 2 allows an operator to operate. The operation device 2 corresponds to a parameter design assistance device according to an aspect of the present invention. The operation device 2 creates evaluation recipes according to operation by the operator. The operation device 2 also operates the substrate processing device 1 based on the evaluation recipes. Respective processed substrates 11a are consequently produced according to the evaluation recipes. Note that each evaluation recipe (recipe) represents information required to operate the substrate processing device 1. Specifically, each evaluation recipe (recipe) represents respective target values of parameters (parameters values) required to operate the substrate processing device 1. Each evaluation recipe (recipe) also represents procedure of predetermined processing to be performed by the substrate processing device 1.

The inspection device 3 inspects the processed substrates 11a and generates respective pieces of inspection result data (each of which is data indicating characteristic values) of the processed substrates 11a. The inspection device 3 transmits the pieces of inspection result data to the operation device 2 via the communication cable 4. The inspection of the processed substrate 11a is not limited in particular as long as the inspection is based on processing contents by the substrate processing device 1. For example, when the substrate processing device 1 performs cleaning processing, the inspection device 3 may be a device that measures particles. When the substrate processing device 1 performs etching processing, the inspection device 3 may be a device that measures an etching amount.

Figure 2:
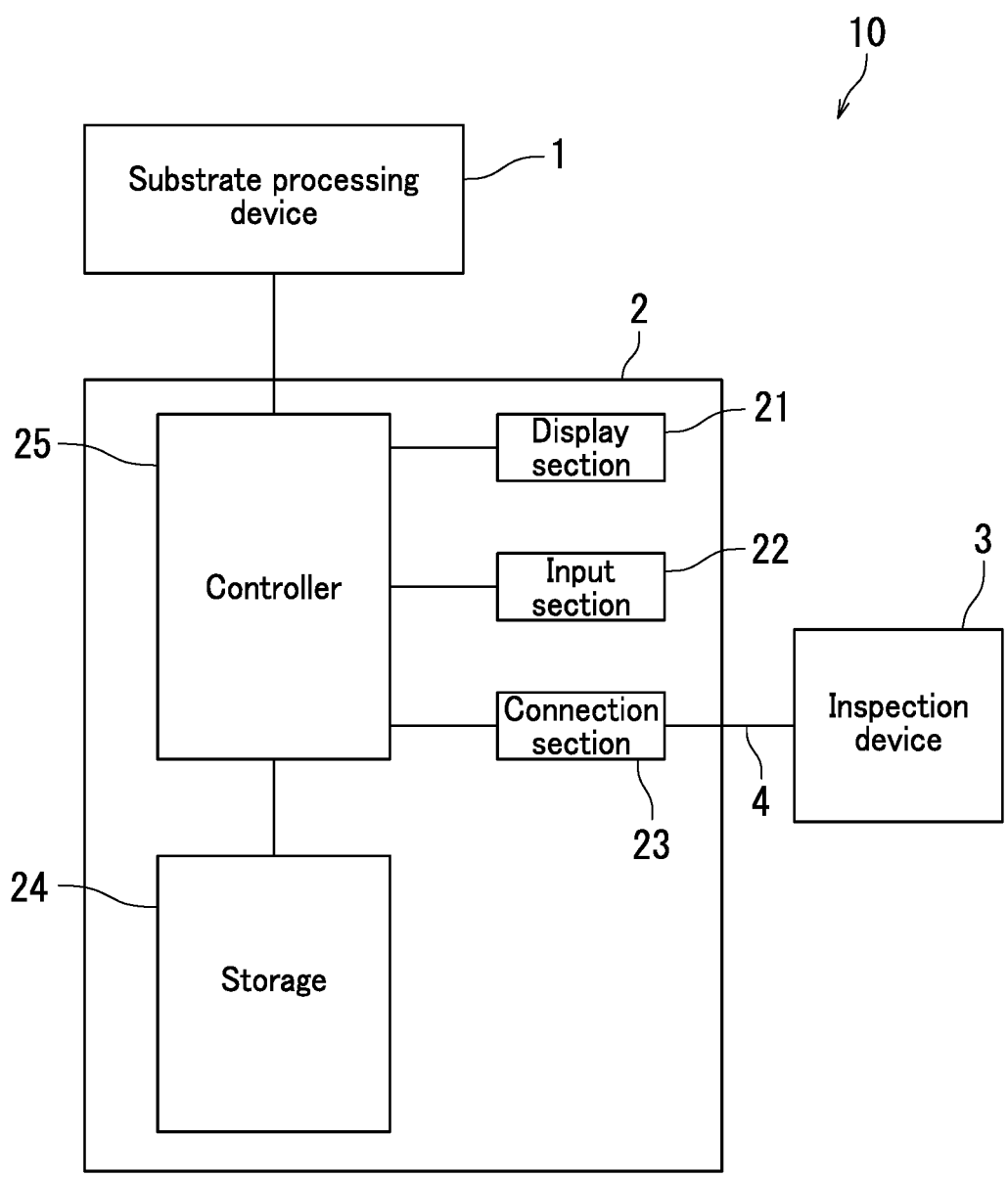
FIG. 2 illustrates a configuration of an operation device according to the first embodiment of the present invention.

A configuration of the operation device 2 will then be described with reference to FIG. 2. FIG. 2 illustrates a configuration of the operation device 2. As illustrated in FIG. 2, the operation device 2 includes a display section 21, an input section 22, a connection section 23, storage 24, and a controller 25.

The display section 21 displays various on-screen images. The display section 21 is a display device, typical examples of which include a liquid-crystal display and an organic electroluminescent (EL) display. In the present embodiment, the display section 21 displays on-screen settings that allow various pieces of information required for a parameter design to be entered therein. Each on-screen setting is typically an on-screen dialog.

The input section 22 is a user interface device that allows the operator to operate. The input section 22 allows the operator to enter an instruction (control signal) in the controller 25 according to operation by the operator. The input section 22 also allows the operator to enter data in the controller 25 according to operation by the operator. The present embodiment enables the operator to operate the input section 22 to enter (register or set) various pieces of information in the on-screen settings displayed on the display section 21. Typical examples of the input section 22 include a keyboard and a mouse. Note that the examples of the input section 22 may further include a touch sensor. The touch sensor is superposed on a display surface of the display section 21. The touch sensor generates a signal according to touch operation onto a display surface thereof by the operator. This enables the operator to enter various instructions in the operation device 2 by the touch operation.

The connection section 23 includes a terminal to which one end of the communication cable 4 is connected. The connection section 23 may be for example a network interface such as a local area network (LAN) board. The pieces of inspection result data transmitted via the communication cable 4 is entered in the controller 25 via the connection section 23.

The storage 24 stores therein various pieces of information (data) entered as a result of the operator operating the input section 22. The storage 24 also stores therein a control program, a standard recipe, various pieces of on-screen layout information, and the like. The standard recipe includes parameter values (respective values of parameters), to each of which a standard value is set. Configuration examples of the storage 24 include a hard disk drive (HDD), random access memory (RAM), and read-only memory (ROM). Note that the standard recipe (recipe) may include data representing a list of parameter values of the parameters included in the standard recipe.

The controller 25 is formed from an arithmetic circuit, examples of which include a central processing unit (CPU) and a micro processing unit (MPU). The controller 25 controls respective operations of components constituting the operation device 2 based on the control program (computer program) stored in the storage 24.

In the present embodiment, the controller 25 has modes such as a recipe creating mode, an evaluation recipe executing mode, and a level value evaluating mode. The controller 25 executes different processes according to the modes. The recipe creating mode is a mode for creating evaluation recipes. The evaluation recipe executing mode is a mode for operating the substrate processing device 1 based on the evaluation recipes. The level value evaluating mode is a mode for evaluating level values (respective values of levels) based on the pieces of inspection result data. The recipe creating mode, the evaluation recipe executing mode, and the level value evaluating mode will hereinafter be described with reference to FIGS. 1 and 2.

[Recipe Creating Mode]

In the recipe creating mode, the controller 25 acquires one or more level values for each of control factors. Each of the control factors is a factor of an optimization target. Level values for the control factors represent conditions according to which the substrate processing device 1 is to process the unprocessed substrates 11. Specifically, the controller 25 causes the display section 21 to display an on-screen setting that allows the operator to register respective names (factor names) of the control factors and one or more level values for each of the control factors therein. The setting prompts the operator to operate the input section 22 to enter respective character strings representing the names of the control factors therein. The names of the control factors are consequently registered in the on-screen setting. The setting further prompts the operator to operate the input section 22 to enter one or more level values for each of the control factors therein. The one or more level values for each of the control factors are consequently registered in the on-screen setting. The controller 25 acquires the respective names of the control factors and one or more level values for each of the control factors registered in the on-screen setting. In other words, information representing the respective names of the control factors and one or more level values for each of the control factors registered in the on-screen setting is entered in the controller 25.

When acquiring the level values for the control factors, the controller 25 refers to the standard recipe stored in the storage 24 and searches, from the parameters included in the standard recipe, one or more parameters (parameter names) that match any of the names (factor names) of the control factors registered in the on-screen setting. When the standard recipe includes one or more parameters corresponding to the control factors, the controller 25 causes the display section 21 to display the standard recipe so that the one or more parameters corresponding to the control factors are highlighted. Note that when the standard recipe includes the data representing the list of parameters values, the controller 25 causes the display section 21 to display the list so that the one or more parameters corresponding to the control factors are highlighted.

When the level values for the control factors are fixed, the controller 25 generates, through statistical technique, combination information representing combinations of the level values fixed. After creating the combination information, the controller 25 creates evaluation recipes. Specifically, the controller 25 creates an evaluation recipe for each of the combinations of the level values based on the combination information and the standard recipe stored in the storage 24. Specifically, when the standard recipe includes one or more parameters corresponding to the control factors, the controller 25 changes, namely sets respective parameter values (standard values) of the one or more parameters to one or more corresponding level values of the control factors. Not that when the standard recipe includes no parameter corresponding to the control factors, the controller 25 creates a recipe as an evaluation recipe for each of the combinations of level values. Here, a standard value is set to each parameter value of the recipe.

[Evaluation Recipe Executing Mode]

In the evaluation recipe executing mode, the controller 25 operates the substrate processing device 1 based on the evaluation recipes. Unprocessed substrates 11b are consequently processed on a sheet-by-sheet basis for each of the evaluation recipes.

[Level Value Evaluating Mode]

In the level value evaluating mode, the controller 25 determines, as a parameter value, an optimal value from one or more corresponding level values for each of the control factors. The optimal value as the parameter value is hereinafter referred to as an "optimal value".

Specifically, based on the pieces of inspection result data generated by the inspection device 3, the controller 25 calculates, of respective one or more SN ratios and sensitivity values of one or more level values for each of the control factors, at least the SN ratios. Whether to calculate the sensitivity values is determined according to a characteristic of the parameter design. For example, when the characteristic of the parameter design is a smaller-the-better characteristic, the controller 25 calculates only the SN ratios and does not calculate the sensitivity values. In contrast, when the characteristic of the parameter design is a nominal-the-better characteristic, the controller 25 calculates the SN ratios and the sensitivity values. The input section 22 allows the operator to set the characteristic of the parameter design therein as a result of the operator operating the input section 22. Respective formulas corresponding to the characteristic of the parameter design is used for the calculation of the SN ratios and the sensitivity values.

After calculating respective SN ratios of the level values for the control factors, or respective SN ratios and sensitivity values of the level values for the control factors, the controller 25 determines an optimal value for each of the control factors based on the calculated SN ratios, or the calculated SN ratios and sensitivity values. Specifically, the controller 25 determines, as an optimal value, a level value with the highest SN ratio for each of the control factors. Alternatively, the controller 25 selects, as optimal value candidates for each of the control factors, level values whose sensitivity values are greater than or equal to respective predefined lower limits and less than or equal to respective predefined upper limits (hereinafter may be referred to as "acceptance/reject criteria"). The controller 25 then determines, as an optimal value for each of the control factors, a level value with the highest SN ratio from corresponding optimal value candidates. When the control factors include one or more control factors in each of which one or more sensitivity values are out of respective ranges of acceptance/reject criteria, one or more level values nearest to respective acceptance/reject criteria (upper and lower limits) are selected as one or more optimal values.

Note that the operation device 2 (controller 25) may determine optimal values considering quality or productivity according to an instruction by the operator. Specifically, each level value is given a "weighting" as a result of the operator operating the input section 22. Specifically, when the quality is emphasized, each of SN ratios of level values to increase quality is given a larger weighting, while each of SN ratios of level values to decrease quality is given a smaller weighting. For example, as a level value indicating discharge time of a chemical liquid is larger (discharge time is longer), it is given a larger weighting. When productivity is emphasized, each of SN ratios of level values on processing time to be more shortened is given a larger weighting, whereas each of SN ratios of level values on processing time to be more lengthened is given a smaller weighting. For example, as a level value indicating discharge time of a chemical liquid is smaller (discharge time is shorter), it is given a larger weighting.

When productivity is emphasized, processing time is preferably shortened in a range in which quality can be maintained. It is therefore preferable that the controller 25 determine optimal values through a loss function L. Specifically, the controller 25 computes the loss function L based on a calculated SN ratio and pre-set functional limit A and loss A. Base on a formula below, the controller 25 also adds a loss of a control factor (level value), whose weighting a is individually defined, to the loss function L, thereby correcting the loss function L.

$L'=L+\alpha \times x$, where "L'" represents a corrected loss function and "x" represents a level value.

The controller 25 selects a level value so that the corrected loss function L' is minimized. Specifically, the controller 25 calculates an SN ratio for each of combinations of level values, and selects, from all of the calculated SN ratios, an SN ratio by which the corrected loss function L' is minimized.

Figure 3:
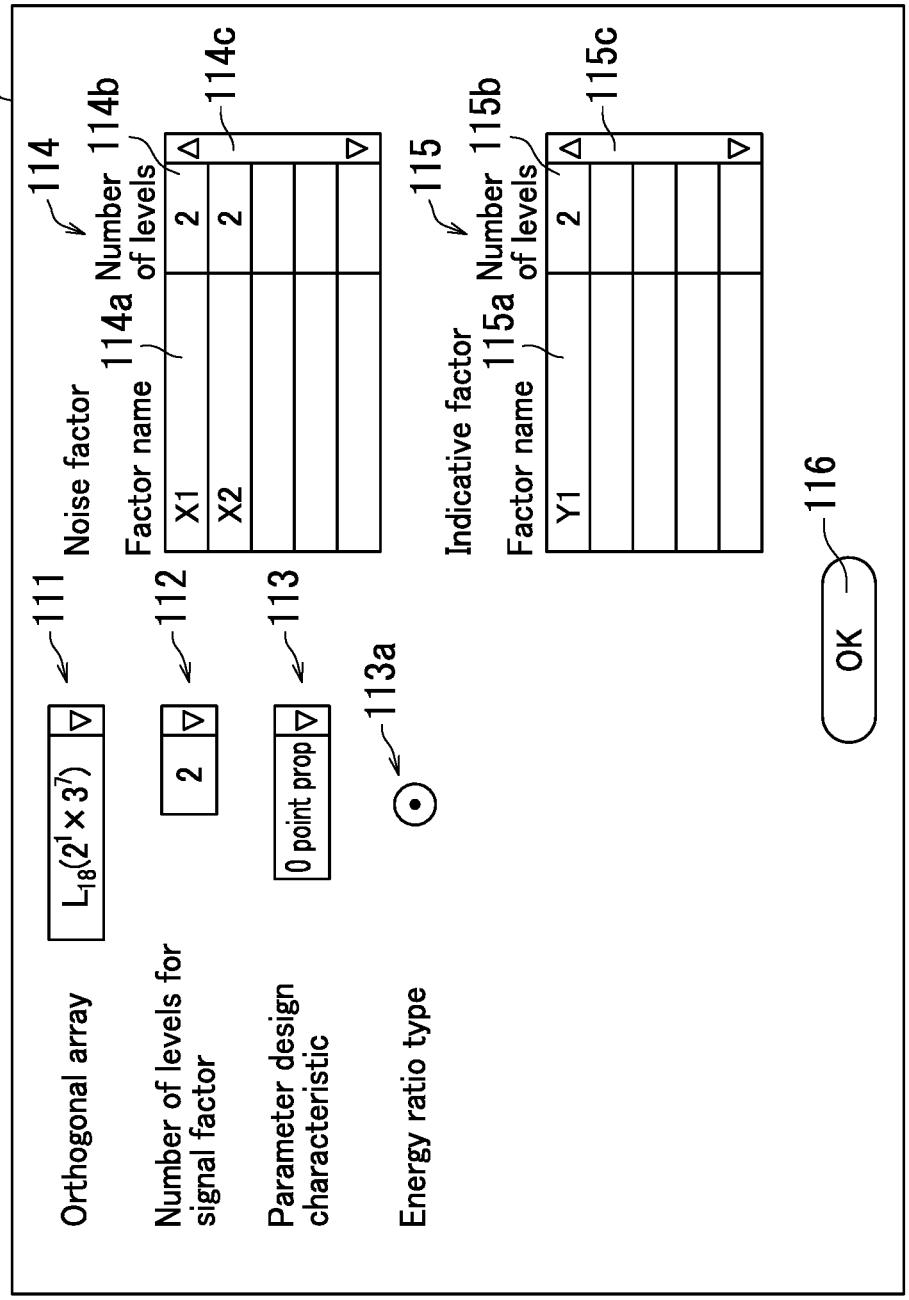
FIG. 3 illustrates a first on-screen setting in the first embodiment of the present invention.
Figure 4:
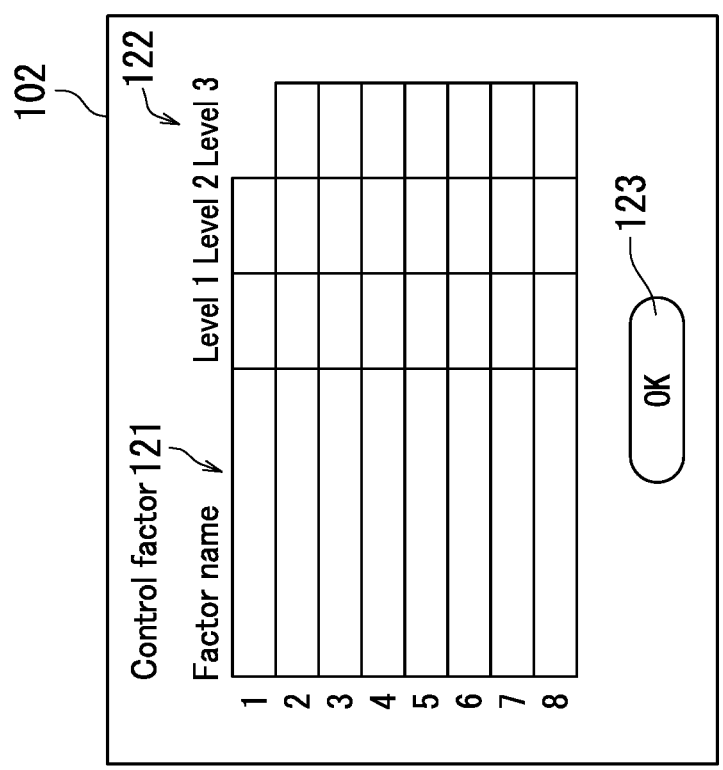
FIG. 4 illustrates a second on-screen setting in the first embodiment of the present invention.
Figure 5:
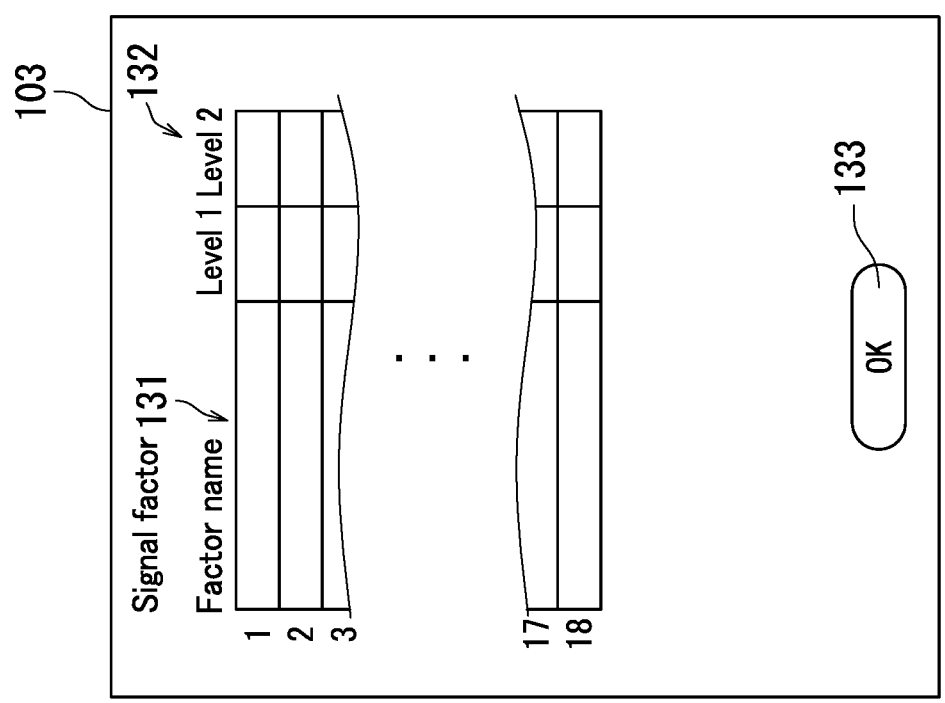
FIG. 5 illustrates a third on-screen setting in the first embodiment of the present invention.
Figure 6:
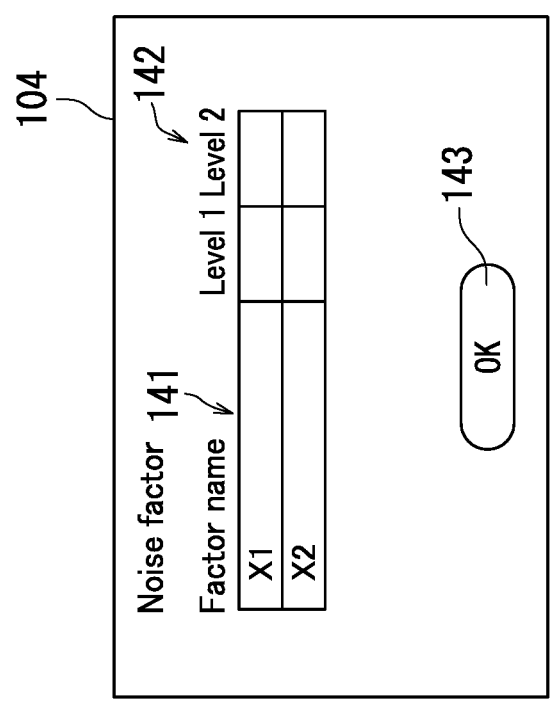
FIG. 6 illustrates a fourth on-screen setting in the first embodiment of the present invention.
Figure 7:
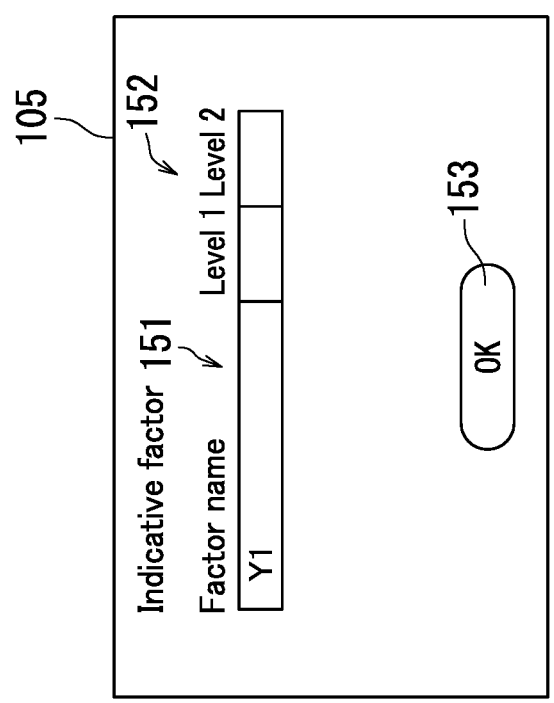
FIG. 7 illustrates a fifth on-screen setting in the first embodiment of the present invention.

Each mode (recipe creating mode, evaluation recipe executing mode, and level value evaluating mode) of the controller 25 has been described above. The on-screen settings will then be described with reference to FIGS. 2 to 7. FIG. 3 illustrates a first on-screen setting 101 in the embodiment. FIG. 4 illustrates a second on-screen setting 102 in the embodiment. FIG. 5 illustrates a third on-screen setting 103 in the embodiment. FIG. 6 illustrates a fourth on-screen setting 104 in the embodiment. FIG. 7 illustrates a fifth on-screen setting 105 in the embodiment.

In the present embodiment, the statistical technique is a Taguchi method or an experimental design method. The controller 25 causes the display section 21 to display on-screen settings that allow the operator to enter (register) information required to create an orthogonal array therein. Specifically, the controller 25 causes the display section 21 to sequentially display the first to third on-screen settings 101 to 103. The controller 25 also causes the display section 21 to display the fourth and fifth on-screen settings 104 and 105 according to information registered in the first on-screen setting 101.

As illustrated in FIG. 3, the first on-screen setting 101 allows the operator to register therein a "orthogonal array type", a "number of signal factor levels", a "parameter design characteristic", "noise factor name and number of levels of noise factor", and "indicative factor name and number of levels of indicative factor". Specifically, the first on-screen setting 101 includes an "orthogonal array type" setting column 111, a "number of signal factor levels" setting column 112, a "parameter design characteristic" setting column 113, a "noise factor name and number of levels of noise factor" setting column 114, a "indicative factor name and number of levels of indicative factor" setting column 115, and an "OK" button 116.

The "orthogonal array type" setting column 111 is a setting column used for setting the "orthogonal array type". In the present embodiment, the "orthogonal array type" setting column 111 allows the operator to select an "orthogonal array type" through a pull-down menu. For example, the "orthogonal array type" setting column 111 allows the operator to select one of arrays as an "orthogonal array type". Here, the arrays include an L4 orthogonal array, an L8 orthogonal array, an L9 orthogonal array, an L12 orthogonal array, an L16 orthogonal array, an L18 orthogonal array, and an L27 orthogonal array. Note that each of the L4, L8, L12, and L16 orthogonal arrays is a two-level orthogonal array, each of the L9 and L27 orthogonal arrays is a three-level orthogonal array, and the L18 orthogonal array is an orthogonal array of a mixed system. The number of control factors and the number of levels for each of the control factors that are registrable in the second on-screen setting 102 to be described with reference to FIG. 4 are determined by selecting the orthogonal array type.

The "number of signal factor levels" setting column 112 is a setting column used for setting the "number of signal factor levels". A numerical value to be set in the "number of signal factor levels" setting column 112 varies according to a corresponding parameter design characteristic. Specifically, when the characteristic that is set in the "parameter design characteristic" setting column 113 is a static characteristic, the "number of signal factor levels" is set to "1". In contrast, when the characteristic that is set in the "parameter design characteristic" setting column 113 is a dynamic characteristic, the "number of signal factor levels" setting column 112 allows the operator to set an arbitrary value of "2" or more thereto.

The "parameter design characteristic" setting column 113 is a setting column used for setting the "parameter design characteristic". In the present embodiment, the "parameter design characteristic" setting column 113 allows the operator to select a "parameter design characteristic" through a pull-down menu. For example, the "parameter design characteristic" setting column 113 allows the operator to select one from items as a "parameter design characteristic". Here, the items include zero-point proportion, reference point proportion, nominal-the-better, larger-the-better, and smaller-the-better. Note that each of the zero-point proportion and the reference point proportion is a dynamic characteristic, while each of the nominal-the-better, the larger-the-better, and the smaller-the-better is a static characteristic.

The "parameter design characteristic" setting column 113 further includes an energy ratio type selecting radio button 113a. The energy ratio type selecting radio button 113a is a button used for changing each of calculation formulas of SN ratio and sensitivity value to a calculation formula of an energy ratio type. Specifically, when the parameter design characteristic is the zero-point proportion, the reference point proportion, or the nominal-the-better, the energy ratio type selecting radio button 113a receives a selection operation by the operator.

The controller 25 determines either the calculation formula of SN ratio or the respective calculation formulas of SN ratio and sensitivity value according to the information registered in the "parameter design characteristic" setting column 113. Specifically, the controller 25 determines either the calculation formula of SN ratio or the respective calculation formulas of SN ratio and sensitivity value according to a characteristic selected from the zero-point proportion, the reference point proportion, the nominal-the-better, the larger-the-better, and the smaller-the-better, as well as whether or not the energy ratio type is selected.

The "noise factor name and number of levels of noise factor" setting column 114 is a setting column used for setting the "noise factor name and number of levels of noise factor". The "noise factor name and number of levels of noise factor" setting column 114 includes a factor name setting column 114a, a number-of-levels setting column 114b, and a scroll bar 114c.

The factor name setting column 114a allows the operator to register respective names of noise factors therein. The number-of-levels setting column 114b allows the operator to register the number of level for each of the noise factors therein. The scroll bar 114c allows the operator to scroll the factor name setting column 114a and the number-of-levels setting column 114b according to operation by the operator through the input section 22. The number of noise factors registrable in the "noise factor name and number of levels of noise factor" setting column 114 is not limited in particular. This configuration enables the operator to register arbitrary number of noise factors therein by operating the scroll bar 114c. The configuration enables the operator to arbitrarily determine whether or not to register noise factors. In other words, the "noise factor name and number of levels of noise factor" setting column 114 allows the operator to set blank therein.

The "indicative factor name and number of levels of indicative factor" setting column 115 is a setting column used for setting the "indicative factor name and number of levels of indicative factor". The "indicative factor name and number of levels of indicative factor" setting column 115 includes a factor name setting column 115a, a number-of-levels setting column 115b, and a scroll bar 115c.

The factor name setting column 115a allows the operator to register names of indicative factors therein. The number-of-levels setting column 115b allows the operator to register the number of levels for each of the indicative factors therein. The scroll bar 115c allows the operator to scroll the factor name setting column 115a and the number-of-levels setting column 115b according to operation by the operator through the input section 22. The number of indicative factors registrable in the "indicative factor name and number of levels of indicative factor" setting column 115 is not limited in particular. This configuration allows the operator to register arbitrary number of indicative factors therein by operating the scroll bar 115c. The configuration also enables the operator to arbitrarily determine whether or not to register indicative factors. In other words, the "indicative factor name and number of levels of indicative factor" setting column 115 allows the operator to set blank therein.

The "OK" button 116 is a button used for fixing the information registered in the first on-screen setting 101. When receiving an instruction from the "OK" button 116 when it is pushed, the controller 25 fixes information registered in the first on-screen setting 101. When receiving the instruction from the "OK" button 116 when it is pushed, the controller 25 also causes the display section 21 to display the second on-screen setting 102 depicted in FIG. 4.

The second on-screen setting 102 will then be described with reference to FIGS. 3 and 4. As illustrated in FIG. 4, the second on-screen setting 102 allows the operator to enter "control factor names and number of levels of control factor" therein. Specifically, the second on-screen setting 102 includes a factor name setting column 121, a level-value setting column 122, and an "OK" button 123. The factor name setting column 121 allows the operator to register respective names of the control factors therein. The level-value setting column 122 allows the operator to register one or more level values (respective values of levels) for each of the control factors therein.

The number of control factors and the number of levels of control factor registrable in the second on-screen setting 102 vary according to the orthogonal array type selected in the "orthogonal array type" setting column 111 as described with reference to FIG. 3. Specifically, the number of rows of the factor name setting column 121 and the level-value setting column 122, and the number of columns of the level-value setting column 122 vary according to the orthogonal array type selected in the "orthogonal array type" setting column 111. FIG. 4 illustrates a second on-screen setting 102 displayed when the L18 orthogonal array is selected in the "orthogonal array type" setting column 111. In this case, the second on-screen setting 102 receives registration of two level values for the control factor in the first row, and receives registration of three level values for each of the control factors in the second to eighth rows.

The present embodiment enables registration of control factors of the substrate processing device 1 from a flow rate of a chemical liquid flowing through a circulation path thereof, a discharge flow rate of the chemical liquid discharged from a nozzle thereof, temperature of the chemical liquid, discharge time of the chemical liquid, a scanning range of a discharge position of the chemical liquid, a scanning speed of the discharge position of the chemical liquid, the number of turns (rotational speed) of the substrate 11, and the like. The present embodiment further enables registration of, as control factors of the substrate processing device 1, non-recipe factors that cannot be controlled by the evaluation recipe. The embodiment enables registration of non-recipe factors of the substrate processing device 1 from a nozzle height position, a nozzle angle, chamber exhaust pressure, and the like.

The "OK" button 123 is a button used for fixing information registered in the second on-screen setting 102. When receiving an instruction from the "OK" button 123 when it is pushed, the controller 25 fixes the information registered in the second on-screen setting 102. When the information registered in the second on-screen setting 102 is fixed, the controller 25 refers to the "orthogonal array type" entered in the first on-screen setting 101 and the "control factor name and level value of control factor" entered in the second on-screen setting 102, and then allocates level values for control factors to the orthogonal array (inside allocation). As a result, combination information representing combinations of level values for the control factors is generated.

When receiving an instruction from the "OK" button 123 when it is pushed, the controller 25 causes the display section 21 to display the third on-screen setting 103 depicted in FIG. 5. The third on-screen setting 103 will then be described with reference to FIGS. 3 and 5.

As illustrated in FIG. 5, the third on-screen setting 103 allows the operator to register "signal factor name and level value for signal factor" therein. Specifically, the third on-screen setting 103 includes a factor name setting column 131, a level-value setting column 132, and an "OK" button 133. The factor name setting column 131 allows the operator to register respective names of signal factors therein. The level-value setting column 132 allows the operator to register one or more level values (respective values of levels) for each of the signal factors therein.

The number of columns in the level-value setting column 132 varies according to the numeral value entered in the "number of signal factor levels" setting column 112 described with reference to FIG. 3. FIG. 5 illustrates a third on-screen setting 103 displayed when "2" is entered in the "number of signal factor levels" setting column 112. The number of rows of the factor name setting column 131 and the level-value setting column 132 varies according to whether or not the "energy ratio type" is selected at the energy ratio type selecting radio button 113a of the first on-screen setting 101. Specifically, the energy ratio type is selected when level values for signal factors vary for each trial (for each of the combinations of level values for each control factor). When the "energy ratio type" is selected, the number of rows of the factor name setting column 131 and the level-value setting column 132 corresponds to the number of combinations of level values for each control factor. The third on-screen setting 103 receives registration of levels values for signal factors for each of the combinations of level values for each control factor. Note that FIG. 5 illustrates a third on-screen setting 103 displayed when the L18 orthogonal array and the energy ratio type are selected in the first on-screen setting 101.

The "OK" button 133 is a button used for fixing information registered in the third on-screen setting 103. When receiving an instruction from the "OK" button 133 when it is pushed, the controller 25 fixes the information registered in the third on-screen setting 103. When the information registered in the third on-screen setting 103 is fixed, the controller 25 refers to the third on-screen setting 103, and then allocates level values for signal factors to the orthogonal array (outside allocation).

When at least one noise factor is registered in the "noise factor name and number of levels of noise factor" setting column 114 of the first on-screen setting 101 described with reference to FIG. 3, the controller 25 causes the display section 21 to display the fourth on-screen setting 104 illustrated in FIG. 6 according to an instruction from the "OK" button 133 when it is pushed.

The fourth on-screen setting 104 will then be described with reference to FIGS. 3 and 6. As illustrated in FIG. 6, the fourth on-screen setting 104 allows the operator to register "level value for noise factor" therein. Specifically, the fourth on-screen setting 104 includes a factor name displaying column 141, a level value setting column 142, and an "OK" button 143. The factor name displaying column 141 displays factor names registered in the factor name setting column 114a of the first on-screen setting 101 illustrated in FIG. 3. The level value setting column 142 allows the operator to register one or more level values for each of the noise factors therein.

The number of rows of the factor name displaying column 141 and the level value setting column 142 varies according to the number of noise factors registered in the "noise factor name and number of levels of noise factor" setting column 114 of the first on-screen setting 101 illustrated in FIG. 3. In addition, the number of columns of the level value setting column 142 varies according to the numeral value entered in the number-of-levels setting column 114b of the first on-screen setting 101 illustrated in FIG. 3. FIG. 6 illustrates a fourth on-screen setting 104 displayed when two factor names of "X1" and "X2" are registered in the factor name setting column 114a of the first on-screen setting 101, and the number of levels of the noise factor "X1" and the number of levels of the noise factor "X2" are set to "2" each in the number-of-levels setting column 114b of the first on-screen setting 101.

The "OK" button 143 is a button used for fixing information registered in the fourth on-screen setting 104. When receiving an instruction from the "OK" button 143 when it is pushed, the controller 25 fixes the information registered in the fourth on-screen setting 104. When the information registered in the fourth on-screen setting 104 is fixed, the controller 25 refers to the fourth on-screen setting 104, and then allocates level values for the noise factors to the orthogonal array (outside allocation).

When at least one indicative factor is registered in the "indicative factor name and number of levels of indicative factor" setting column 115 of the first on-screen setting 101 described with reference to FIG. 3, the controller 25 causes the display section 21 to display the fifth on-screen setting 105 illustrated in FIG. 7 according to an instruction from the "OK" button 143 when it is pushed. Note that the fifth on-screen setting 105 may be displayed according to the instruction from the "OK" button 133, when it is pushed, of the third on-screen setting 103 described with reference to FIG. 5. Specifically, when the "noise factor name and number of levels of noise factor" setting column 114 of the first on-screen setting 101 illustrated in FIG. 3 is blank, and one or more indicative factors are registered in the "indicative factor name and number of levels of indicative factor" setting column 115 of the first on-screen setting 101, the fifth on-screen setting 105 is displayed on the display section 21 according to the instruction from the "OK" button 133, when it is pushed, of the third on-screen setting 103.

The fifth on-screen setting 105 will then be described with reference to FIGS. 3 and 7. As illustrated in FIG. 7, the fifth on-screen setting 105 allows the operator to register "level value for indicative factor" therein. Specifically, the fifth on-screen setting 105 includes a factor name displaying column 151, a level value setting column 152, and an "OK" button 153. The factor name displaying column 151 displays one or more factor names registered in the factor name setting column 115a of the first on-screen setting 101. The level value setting column 152 allows the operator to register one or more level values for each of indicative factors therein.

The number of rows of the factor name displaying column 151 and the level value setting column 152 varies according to the number of indicative factors registered in the "indicative factor name and number of levels of indicative factor" setting column 115 of the first on-screen setting 101 illustrated in FIG. 3. In addition, the number of columns of the level value setting column 152 varies according to the numeral value entered in the number-of-levels setting column 115b of the first on-screen setting 101 illustrated in FIG. 3. FIG. 7 illustrates a fifth on-screen setting 105 displayed when one factor name "Y1" is registered in the factor name setting column 115a of the first on-screen setting 101 and the number of levels of the factor name "Y1" is set to "2".

The "OK" button 153 is a button used for fixing information registered in the fifth on-screen setting 105. When receiving an instruction from the "OK" button 153 when it is pushed, the controller 25 fixes the information registered in the fifth on-screen setting 105. When the information registered in the fifth on-screen setting 105 is fixed, the controller 25 refers to the fifth on-screen setting 105, and then allocates level values for indicative factors to the orthogonal array (outside allocation).

The on-screen settings (first to fifth on-screen settings 101 to 105) have been described above with reference to FIGS. 2 to 7. Note that the recipe (standard recipe) for the substrate processing device 1 possibly includes parameters corresponding to one or more signal factors. When the number of levels for a signal factor is two or more and one or more parameters corresponding to the signal factor is included in the standard recipe, the controller 25 generates combination information representing combinations of level values for the signal factor and level values for the control factors. The combination information is generated by allocating the level values for the signal factor and the level values for the control factors to the orthogonal array like the combination information of level values for the control factors.

Figure 8:
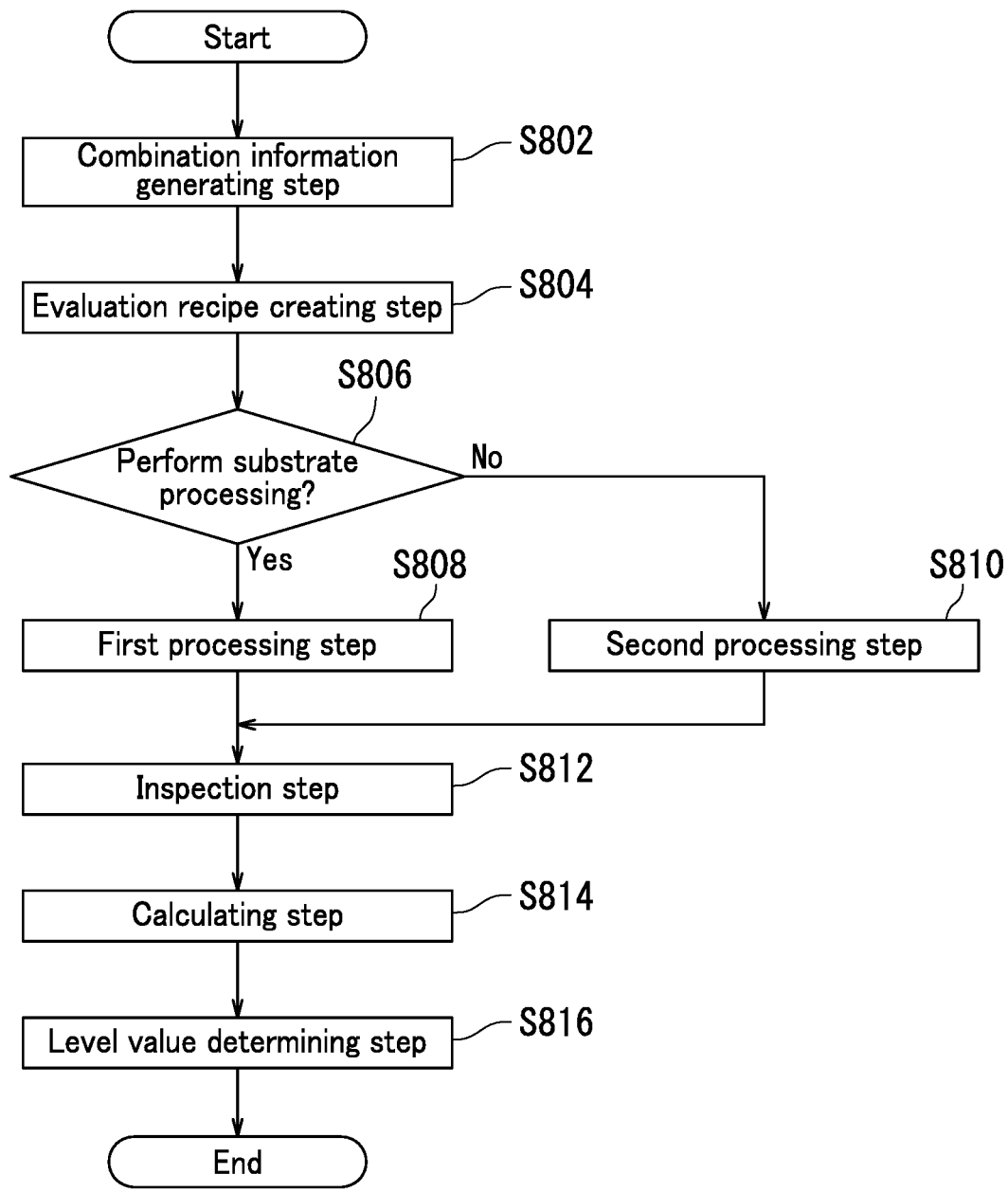
FIG. 8 is a flow chart of the parameter design assistance system according to the first embodiment of the present invention.

The parameter design assistance system 10 according to the present embodiment will further be described with reference to FIGS. 1 to 8. FIG. 8 is a flow chart of the parameter design assistance system 10 according to the present embodiment. In other words, FIG. 8 depicts a parameter design assistance method according to the present embodiment.

As illustrated in FIG. 8, the parameter design assistance method according to the present embodiment includes a combination information generating step S802, an evaluation recipe creating step S804, a selecting step S806, a first processing step S808, a second processing step S810, an inspection step S812, a calculating step S814, and a level value determining step S816.

[Combination Information Generating Step S802]

When an operator operates the input section 22 to change a mode of the operation device 2 (controller 25) to the recipe creating mode, the combination information generating step S802 is started. In the combination information generating step S802, the controller 25 acquires one or more level values for each of control factors. The controller 25 then generates, through the statistical technique, combination information representing combinations of the level values acquired.

Specifically, the controller 25 causes the display section 21 to display the on-screen settings (first to fifth on-screen settings 101 to 105) to prompt the operator to enter (register) information required to create an orthogonal array therein. The information required to create the orthogonal array is accordingly entered in the controller 25.

Note that when the standard recipe includes one or more parameters corresponding to the control factors as described with reference to FIG. 2, the controller 25 causes the display section 21 to display the standard recipe or the list of parameter values so that the one or more parameters corresponding to the control factors are highlighted. The standard recipe or the list of parameter values may be displayed after the controller 25 receives the instruction from the "OK" button 116, when it is pushed, in the second on-screen setting 102 described with reference to FIG. 4. Similarly, when the standard recipe includes one or more parameters corresponding to a signal factor(s), the controller 25 causes the display section 21 to display the standard recipe or the list of parameter values so that the one or more parameters corresponding to the signal factor are highlighted. The standard recipe or the list of parameter values may be displayed after the controller 25 receives the instruction from the "OK" button 133, when it is pushed, in the third on-screen setting 103 described with reference to FIG. 5.

The controller 25 allocates the level values to the orthogonal array, and subsequently assigns respective identifiers to the combinations of level values for the control factors. Alternatively, the controller 25 assigns respective identifiers to combinations of level values of the signal factor(s) and the level values for the control factors. Hereinafter, "combinations of level values for control factors" and "combinations of level values for signal factor(s) and level values for control factors" may be collectively described as "combinations of level values". The controller 25 stores combinations of level values in the storage 24 with respective identifiers related to the combinations of level values.

After assigning the respective identifiers to the combinations of level values, the controller 25 causes the display section 21 to display the orthogonal array and the identifiers. Specifically, the controller 25 causes the display section 21 to display the orthogonal array and the identifiers so that correspondence between the identifiers and the combinations of level values can be recognized. This enables the operator to recognize the number of combinations of level values (number of evaluation recipes) and the respective identifiers assigned to the combinations of level values (evaluation recipes).

[Evaluation Recipe Creating Step S804]

After generating the combination information, the controller 25 creates an evaluation recipe for each of the combinations of level values based on the standard recipe and the combination information. Specifically, as already described, the controller 25 changes, of the parameters included in the standard recipe, respective one or more parameter values (standard values) of one or more parameters matching any of names of the control factors registered in the on-screen setting (second on-screen setting 102) to one or more corresponding level values for the control factors. Similarly, the controller 25 changes (sets), of the parameters included in the standard recipe, respective one or more parameter values (standard values) of one or more parameters (parameter names) matching name(s) (factor name(s)) of the signal factor(s) registered in the on-screen setting (third on-screen setting 103) to one or more corresponding level values for the signal factor(s). Note that when the standard recipe includes no parameter corresponding to the control factors and the signal factor(s), the controller 25 creates, as an evaluation recipe, a recipe in which a standard value is set to each parameter value for each of the combinations of level values.

[Selecting Step S806]

After creating the evaluation recipes, the controller 25 causes the display section 21 to display an on-screen selection (on-screen dialog) for inquiring whether or not processing of the substrate 11 be performed. When the operator operates the input section 22 and then enters a selection instruction to perform the processing of the substrate 11 (Yes in Step S806), the controller 25 changes a mode thereof from the recipe creating mode to the evaluation recipe executing mode. In contrast, when the operator operates the input section 22 and then enters a selection instruction not to perform the processing of the substrate 11 (No in Step S806), the controller 25 changes the mode thereof from the recipe creating mode to a stand-by mode. The stand-by mode is a mode for waiting for an instruction input by the operator.

[First Processing Step S808]

When the operator enters the selection instruction to perform the processing of the substrate 11 (Yes in Step S806), the first processing step S808 is started. Specifically, the controller 25 changes from the recipe creating mode to the evaluation recipe executing mode and operates the substrate processing device 1 based on the evaluation recipes stored in the storage 24. This therefore prompts the operator to set substrates 11 whose number corresponds to the number of evaluation recipes in the substrate processing device 1 before the selection instruction to perform the processing of the substrate 11 is entered in the selecting step S806.

[Second Processing Step S810]

When the operator operates the input section 22 to enter therein an instruction to execute the evaluation recipes, the second processing step S810 is started. The operation device 2 (controller 25) when it is in the stand-by mode allows the operator to enter the instruction to execute the evaluation recipes therein. When the operator enters the instruction to execute the evaluation recipes, the controller 25 changes from the stand-by mode to the evaluation recipe executing mode and then operates the substrate processing device 1 based on the evaluation recipes.

Note that when receiving the instruction to execute the evaluation recipes, the operation device 2 (controller 25) may cause the display section 21 to display an on-screen dialog that prompts the operator to enter the number of evaluation recipes to be executed at once. In this case, the second processing step S810 may be executed plural times until execution of all the evaluation recipes stored in the storage 24 is completed. When receiving the instruction to execute the evaluation recipes, the operation device 2 (controller 25) may cause the display section 21 to display an on-screen dialog that allows the operator to enter respective identifiers of evaluation recipes to be executed therein. This makes it possible to set the number of evaluation recipes to be executed at once to an arbitrary number and to change execution orders of the evaluation recipes.

[Inspection Step S812]

In the inspection step S812, the inspection device 3 inspects respective processed substrates 11a corresponding to the evaluation recipes and then generates inspection result data corresponding to each evaluation recipe. Specifically, the inspection device 3 inspects the substrate 11 on a sheet-by-sheet basis. When the operator causes the inspection device 3 to perform the inspection, the inspection device 3 allows the operator to enter data representing an identifier assigned to an evaluation recipe (combination of level values) corresponding to a processed substrate 11a as an inspection target therein. The inspection device 3 transmits the entered data representing the identifier along with corresponding inspection result data to the operation device 2.

When receiving the inspection result data and the identifier, the controller 25 searches a combination of level values assigned an identifier matching the received identifier from the combinations of level values stored in the storage 24. The controller 25 stores the received inspection result data in the storage 24 with the date related to the searched combination of level values.

[Calculating Step S814]

When the operator operates the input section 22 and then enters therein an instruction to evaluate level values, the calculating step S814 is started. The operation device 2 (controller 25) when it is in the stand-by mode allows the operator to enter the instruction to evaluate level values therein. When the operator enters the instruction to evaluate level values, the controller 25 changes from the stand-by mode to the level value evaluating mode, and then calculates, of respective SN ratios and sensitivity values of level values for the control factors, at least the SN ratios. Specifically, according to the parameter design characteristic that has been set in the combination information generating step S802, the controller 25 calculates the SN ratios, or the SN ratios and the sensitivity values. Typically, the controller 25 creates a graph of factorial effects about the SN ratios, or respective graphs of factorial effects about the SN ratios and the sensitivity values.

[Level Value Determining Step S816]

When the controller 25 calculates the SN ratios, or the SN ratios and the sensitivity values, the level value determining step S816 is started. In the level value determining step S816, the controller 25 determines an optimal value among one or more corresponding level values for each of the control factors based on the calculated SN ratios, or the calculated SN ratios and sensitivity values. The controller 25 further causes the display section 21 to display the optimal values. The flow chart depicted in FIG. 8 then ends.

The graph of factorial effects about the SN ratios, and the graph of factorial effects about the sensitivity values will then be described with reference to FIGS. 9A to 9C. FIG. 9A is a table representing an example of a relationship between control factors and level values. FIG. 9B depicts an example of a graph of factorial effects about SN ratios. FIG. 9C depicts an example of a graph of factorial effects about sensitivity values.

FIG. 9A depicts control factor names "A" to "H" and standard values "A1", "A2" and the like. In FIG. 9B, the horizontal axis indicates respective level values for the control factors A to H, and the vertical axis indicates an SN ratio [db]. As illustrated in FIG. 9B, an SN ratio is plotted for each level value. In parameter designs, the value of an SN ratio increases as the variation decreases. In FIG. 9C, the horizontal axis indicates respective level values of the control factors A to H, and the vertical axis indicates a sensitivity value [db]. As illustrated in FIG. 9C, a sensitivity value is plotted for each level value. The sensitivity value represents the output.

Figure 10:
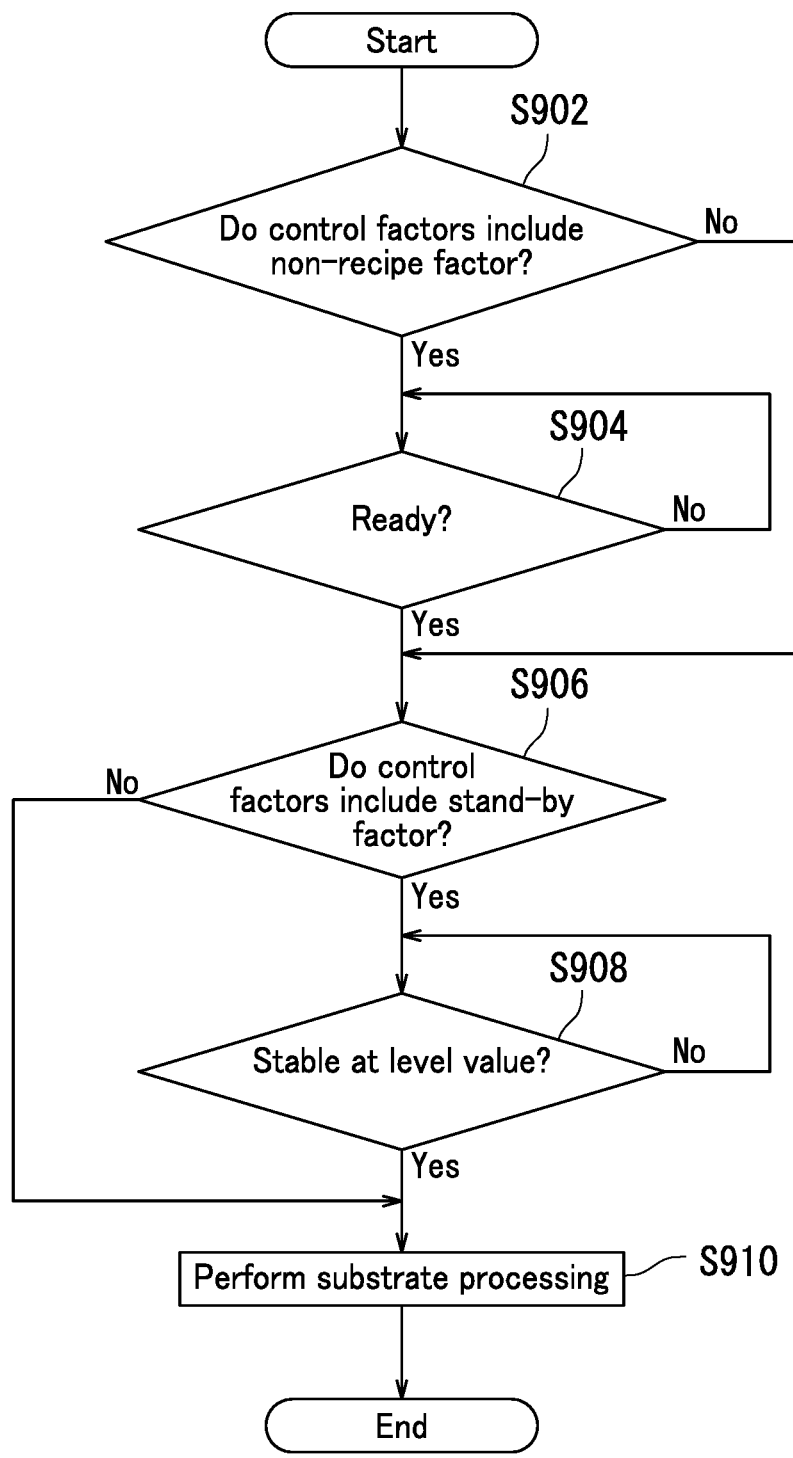
FIG. 10 illustrates a processing process in the first embodiment of the present invention.

The processing steps (first processing step S808 and second processing step S810) will then be described with reference to FIGS. 2 and 10. FIG. 10 illustrates a processing process in the present embodiment. Specifically, FIG. 10 is a flow chart depicting processing of one unprocessed substrate 11b.

As illustrated in FIG. 10, when processing the unprocessed substrate 11, the controller 25 determines whether or not the control factors include a non-recipe factor (Step S902). Specifically, the controller 25 refers to an identifier assigned to an evaluation recipe (combination of level values) corresponding to the unprocessed substrate 11b as a processing target, and then determines whether or not the control factors allocated to an orthogonal array corresponding to the evaluation recipe include one or more non-recipe factors. As already described, the non-recipe factor is a factor that cannot be controlled by the evaluation recipe. Typically, the non-recipe factor is a factor that requires manual adjustment by the operator.

When determining that the control factors include one or more non-recipe factors (Yes in Step S902), the controller 25 causes the display section 21 to display a ready button (Step S904). The operator sets all non-recipe factors to corresponding level values, and then operates the input section 22 to enter an instruction therein by pushing the ready button (Yes in Step S904). The controller 25 causes the substrate processing device 1 to suspend performance of predetermined processing until receiving an instruction from the ready button when it is pushed by the operator (No in Step S904). In other words, the controller 25 causes the substrate processing device 1 to suspend the performance of the predetermined processing until all non-recipe factors reach corresponding level values.

The instruction (ready instruction) obtained from the ready button when it is pushed indicates that all the non-recipe factors reach the corresponding level values. When the input section 22 receives the ready instruction, the controller 25 determines whether or the control factors include one or more stand-by factors (Step S906). Alternatively, when determining that the control factors do not include any non-recipe factor (No in Step S902), the controller 25 determines whether or not the control factors include one or more stand-by factors (Step S906). Specifically, the controller 25 refers to an identifier assigned to an evaluation recipe (combination of level values) corresponding to the unprocessed substrate 11b as the processing target, and then determines whether or not control factors allocated to an orthogonal array corresponding to the evaluation recipe include one or more stand-by factors. The stand-by factor is a control factor corresponding to a parameter that needs to wait until a parameter value thereof stabilizes at a corresponding level value. Examples of the stand-by factor include temperature of a chemical liquid, and a flow rate of a chemical liquid flowing through the circulation path.

When determining that the control factors include a stand-by factor(s) (Yes in Step S906), the controller 25 determines whether or not a parameter value of a parameter corresponding to the stand-by factor stabilizes at a corresponding level value of the stand-by factor (Step S 908). For example, when the control factors include temperature of a chemical liquid as the stand-by factor, and the temperature of the chemical liquid changes from 100° C. to 150° C., it is determined whether or not the temperature of the chemical liquid stabilizes in a range of 150+/−0.2° C.

The controller 25 causes the substrate processing device 1 to suspend performance of predetermined processing until the parameter value of the parameter corresponding to the stand-by factor(s) stabilizes at a corresponding level value (No in Step S908).

When determining that the parameter value of the parameter corresponding to the stand-by factor(s) stabilizes at the corresponding level value (Yes in Step S908), the controller 25 causes the substrate processing device 1 to process the unprocessed substrate 11b (Step S910). Alternatively, when determining that the control factors do not include any stand-by factor (No in Step S906), the controller 25 causes the substrate processing device 1 to process the unprocessed substrate 11b (Step S910). When processing of the unprocessed substrate 11b is completed, the flow chart depicted in FIG. 110 ends.

Note that when causing the display section 21 to display the ready button, the controller 25 may cause the display section 21 to display a message that prompts the operator to adjust the non-recipe factor.

The first embodiment has been described above. In the present embodiment, the evaluation recipes are created without causing the operator to change any parameter value included in the standard recipe via an on-screen dialog. This enables reduction in the burden on the operator. This saves the operator from having to enter parameter values, thereby enabling reduction in time required for a parameter design. In other words, it is possible to reduce time required to create a robustness recipe.

In the present embodiment, the SN ratios of level values for the control factors, or the SN ratios and the sensitivity values of the level values for the control factors are calculated without causing the operator to enter any inspection result via an on-screen dialog. This enables reduction in the burden on the operator.

In the present embodiment, the controller 25 determines an optimal value as a parameter value among one or more corresponding level values for each of the control factors. This enables reduction in the burden on the operator.

The present embodiment enables the operator to select whether or not to change a mode of the operation device 2 (controller 25) from the recipe creating mode to the evaluation recipe executing mode (selecting step S806). It can therefore be avoided that one operator continues to occupy the substrate processing device 1 from the creation of the evaluation recipes to the end of the trial.

The present embodiment enables execution of the evaluation recipes in a distributed manner (second processing step S810). It can therefore be avoided that one operator continues to occupy the substrate processing device 1 from the start to the end of the trial.

In the present embodiment, it is possible to register, as a control factor, a factor that cannot be controlled by the evaluation recipes. More factors can therefore be candidates for control factors. This improves precision of a parameter design.

Note that although the inspection step S812 is executed after execution of all the evaluation recipes in the present embodiment, in the case where part of the evaluation recipes is executed in the second processing step S810—in other words, the second processing step S810 is repeated, the inspection step S812 may be executed every time the second processing step S810 is repeated.

Although the inspection device 3 transmits inspection result data and corresponding identifier data to the operation device 2 every time the substrate 11 is inspected in the present embodiment, the inspection device 3 may transmit the pieces of inspection result data and the pieces of corresponding identifier data to the operation device 2 after all the processed substrates 11a corresponding to the evaluation recipes are inspected.

Although the operator selects the orthogonal array type in the present embodiment, the controller 25 may select an orthogonal array type according to the number of control factors.

Although the controller 25 determines the optimal values in the present embodiment, the operator may determine the optimal values. For example, the controller 25 causes the display section 21 to display the graph of factorial effects about the SN ratios, or the respective graphs of factorial effects about the SN ratios and the sensitivity values, and in this state the operator may determine the optimal values from the graph(s) of factorial effects.

Although the inspection device 3 enters inspection result data to the operation device 2 via the communication cable 4 in the present embodiment, the operator may operate the input section 22 to enter the inspection result data to the operation device 2. In this case, the operation device 2 may display an on-screen dialog that allows inspection result data to be entered therein.

Second Embodiment

A second embodiment of the present invention will then be described with reference to FIGS. 1, 2, 11, and 12. However, items different from the first embodiment will be described, and descriptions of the same items as the first embodiment will be omitted. The second embodiment differs from the first embodiment in that combination information generation and evaluation recipe creation are repeated predetermined times. In addition, the second embodiment differs from the first embodiment in that when the combination information generation is repeated, levels values for each control factor are set to values different from previous values.

FIG. 11 illustrates an example of a second on-screen setting 102 in the present embodiment. The second on-screen setting 102 in the present embodiment allows an operator to register "control factor name and level value range for control factor" therein. Specifically, as illustrated in FIG. 11, the second on-screen setting 102 includes a factor name setting column 121, a level-value-range setting column 124, and an "OK" button 123. The factor name setting column 121 allows the operator to register respective names of the control factors therein. The level-value-range setting column 124 allows the operator to register a "level value range" for each control factor therein. Specifically, the level-value-range setting column 124 allows the operator to register an upper limit and a lower limit of the level value range therein. The "OK" button 123 is a button used for fixing information registered in the second on-screen setting 102.

Note that FIG. 11 illustrates a second on-screen setting 102 displayed when an L18 orthogonal array is selected in an "orthogonal array type" setting column 111 of a first on-screen setting 101, like that described with reference to FIG. 3. The number of control factors registrable in the second on-screen setting 102 vary according to an orthogonal array type selected in the "orthogonal array type" setting column 111.

Figure 12:
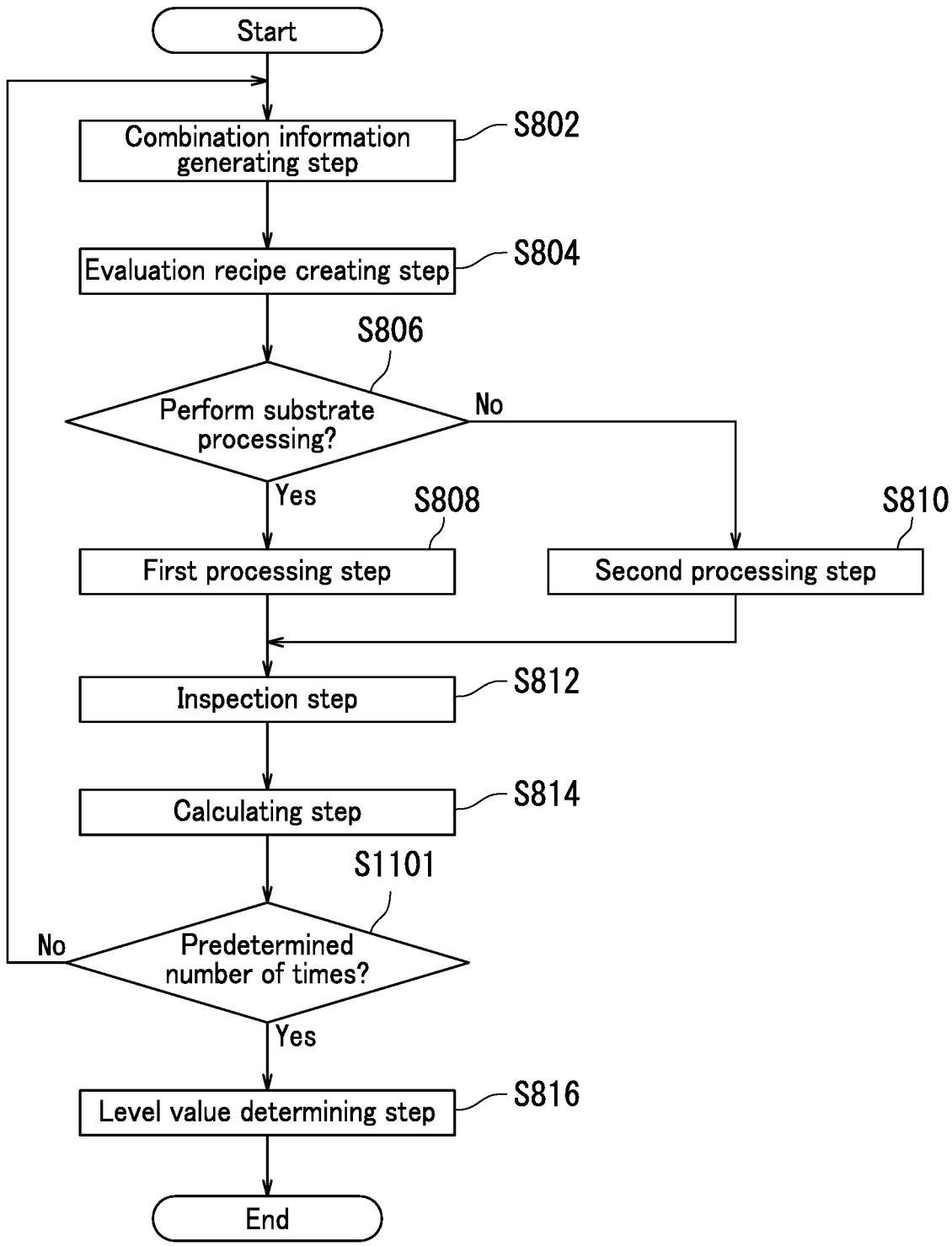
FIG. 12 is a flow chart of a parameter design assistance system according to the second embodiment of the present invention.

FIG. 12 is a flow chart of a parameter design assistance system 10 according to the present embodiment. In FIG. 12, an evaluation recipe creating step S804, a selecting step S806, a first processing step S808, a second processing step S810, an inspection step S812, a calculating step S814, and a level value determining step S816 are similar to those in the flow chart of the first embodiment described with reference to FIG. 8. The detailed explanation is therefore omitted.

In a combination information generating step S802 of the present embodiment, an input section 22 allows the operator to register a corresponding level value range for each of the control factors therein. When acquiring one or more level values for each control factor, a controller 25 acquires one or more values included in the corresponding level value range. In other words, the controller 25 determines, as a level value, at least one value among the values included in the level value range.

Specifically, the controller 25 causes a display section 21 to display the second on-screen setting 102 described with reference to FIG. 11. The on-screen setting 102 allows the operator to register "control factor name and level value range for control factor" therein. When the "control factor name and level value range for control factor" is set in the second on-screen setting 102, the controller 25 allocates, as one or more level value for each control factor, one or more values included in the corresponding level value range to an orthogonal array.

Specifically, the operator may set the level value range for each control factor to an arbitrary range considering throughput. Alternatively, the operator may set the level value range for each control factor to an arbitrary range considering the mechanism limit or the machine limit of a substrate processing device 1. Alternatively, the operator may set the level value range for each control factor to an arbitrary range considering material properties. For example, when a control factor is temperature of a chemical liquid, a level range for the control factor may be set based on a temperature range where the chemical liquid can act.

When the level value range for each control factor is set, the controller 25 acquires different values from the corresponding level value range by the number of levels assigned to each control factor according to the orthogonal array type. For example, the controller 25 may randomly acquire (determine) level values from the level value range. Alternatively, the controller 25 may calculate step values whose respective positions divide the level value range into equal parts whose number is determined in advance, and randomly acquire (determine) level values from the step values (including the upper and lower limits of the range of level values).

When calculating respective SN ratios of level values for the control factors, or respective SN ratios and sensitivity values of the level values for the control factors (calculating step S814), the controller 25 determines whether or not the number of times the combination information generation and the evaluation recipe creation are repeated matches a predetermined number of times. (Step S1101). The predetermined number of times is preset in a control program stored in storage 24. Alternatively, the operator operates the input section 22 and sets the predetermined number of times thereto. Note that the number of times the combination information generation and the evaluation recipe creation are repeated may be referred to as "repeat frequency" in the description below.

When determining that the repeat frequency does not match the predetermined number of times (No in Step S1101), the controller 25 changes a mode thereof to a recipe creating mode to generate combination information again (combination information generating step S802). When repeatedly generating combination information—combination information generating step S802 is executed twice or more, the controller 25 changes one or more level values for at least one of the control factors.

Specifically, the controller 25 randomly acquires (determines) level values from the level value range, or randomly acquires (determines) level values from the step values, thereby acquiring (determining) level values different from previous level values. For example, when levels for a control factor are three levels, two level values are randomly acquired (determined) therefrom, while an average of the two level values may be calculated as a remaining level value. Note that part of level values for each control factor may be changed. For example, when the previous level values for a control factor corresponding to discharge time of a chemical liquid is "5 seconds, 15 seconds, and 25 seconds", next level values may be determined as "15 seconds, 20 seconds, and 25 seconds", or "10 seconds, 15 seconds, 20 seconds".

When determining that the repeat frequency matches the predetermined number of times (Yes in Step S1101), the controller 25 executes a level value determining step S816, thereby determining an optimal value among one or more corresponding level values for each control factor. Note that in the present embodiment, every time the combination information generating step S802 and the evaluation recipe creating step S804 are repeated, the number of level values as candidates of an optimal value of each control factor increases.

The second embodiment of the present invention has been described above. In the present embodiment, when evaluation recipe creation is repeated, an operation device 2 (controller 25) changes level values for the control factors. Therefore, the operator needn't change level values for each control factor via an on-screen dialog. This enables reduction in the burden on the operator.

Third Embodiment

A third embodiment of the present invention will then be described with reference to FIGS. 1, 2, and 13. However, items different from the first and second embodiments will be described, and descriptions of the same items as the first and second embodiments will be omitted. The third embodiment differs from the first and second embodiments in that combination information generation and evaluation recipe creation are repeated until SN ratios and/or sensitivity values are in respective corresponding ranges of acceptance/reject criteria.

Figure 13:
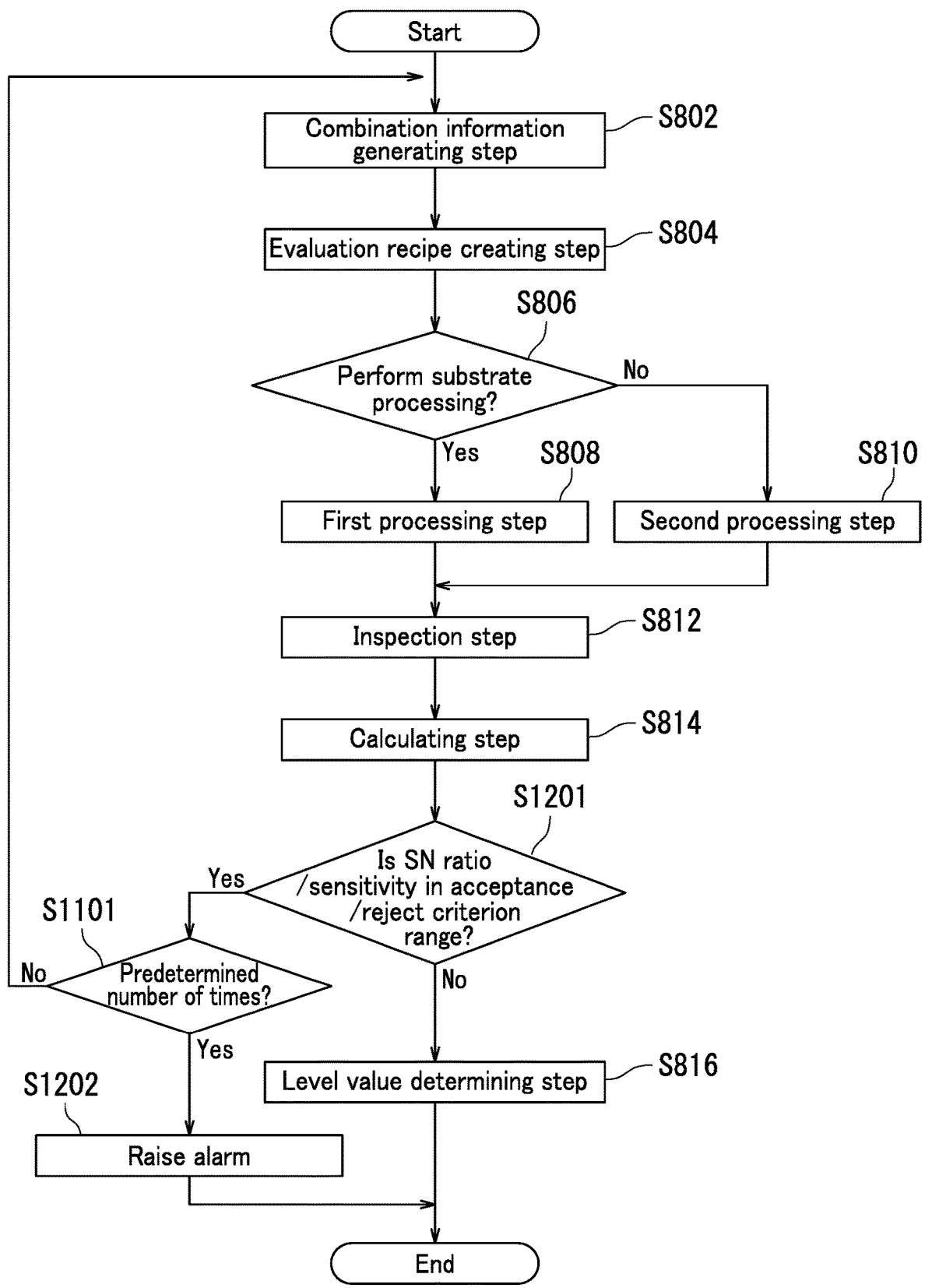
FIG. 13 is a flow chart of a parameter design assistance system according to a third embodiment of the present invention.

FIG. 13 is a flow chart of a parameter design assistance system 10 according to the present embodiment. In FIG. 13, an evaluation recipe creating step S804, a selecting step S806, a first processing step S808, a second processing step S810, an inspection step S812, and a calculating step S814 are similar to those in the flow chart of the first embodiment described with reference to FIG. 8. The detailed explanation is therefore omitted. In addition, a combination information generating step S802 is similar to that in the flow chart of the second embodiment described with reference to FIG. 12, and the detailed explanation is therefore omitted.

As illustrated in FIG. 13, when calculating respective SN ratios of level values for control factors, or respective SN ratios and sensitivity values of the level values for the control factors (calculating step S814), the controller 25 determines whether or not the controller factors include a control factor whose one or more corresponding SN ratios and/or sensitivity values are out of respective corresponding ranges of acceptance/reject criteria (Step S1201). In addition, when determining that a repeat frequency matches a predetermined number of times (Yes in Step S1101), the controller 25 causes a display section to display an on-screen alarm (Step S1202). Note that an operator operates an input section 22 and sets the respective acceptance/reject criteria for corresponding SN ratios and the respective acceptance/reject criteria for corresponding sensitivity values.

Hereinafter, Steps S1201 and S1202 will further be described. In the following description, the respective acceptance/reject criteria for corresponding SN ratios may be referred to as "first acceptance/reject criteria", while the respective acceptance/reject criteria for corresponding sensitivity values may be referred to as "second acceptance/reject criteria".

[Step S1201]

[When Acceptance/Reject Criteria for SN Ratios are Set]

When first acceptance/reject criteria are set for each of control factors, the controller 25 determines whether or not the control factors include a control factor whose one or more corresponding SN ratios are out of respective ranges of first acceptance/reject criteria (Step S1201). Specifically, controller 25 determines whether or not at least one of respective one or more SN ratios of one or more level values for each control factor is in a corresponding range of first acceptance/reject criterion. Note that different upper and lower limits for each control factor may be set as first acceptance/reject criteria.

When determining that the control factors include a control factor whose one or more corresponding SN ratios are out of respective ranges of first acceptance/reject criteria (Yes in Step S1201), the controller 25 determines whether or not the repeat frequency matches the predetermined number of times (Step S1101). When determining that the repeat frequency does not match the predetermined number of times (No in Step S1101), the controller 25 changes a mode thereof to a recipe creating mode to generate combination information again (combination information generating step S802). When repeatedly generating combination information, the controller 25 changes one or more level values for each control factor in each of which it is determined that one or more corresponding SN ratios are out of respective ranges of first acceptance/reject criteria.

When it is determined that the control factors include no control factor whose one or more corresponding SN ratios are out of the respective ranges of first acceptance/reject criteria (No in Step S1201), the controller 25 determines, as an optimal value, a level value with the largest SN ratio among one or more corresponding level values for each control factor (level value determining step S816). The controller 25 then causes the display section 21 to display the optimal value. The flow chart depicted in FIG. 13 then ends.

[When Acceptance/Reject Criteria for Sensitivity Values are Set]

When second acceptance/reject criteria are set for each of control factors, the controller 25 determines whether or not the control factors include a control factor whose one or more corresponding sensitivity values are out of respective ranges of second acceptance/reject criteria (Step S1201). Specifically, the controller 25 determines whether or not at least one of respective one or more sensitivity values of one or more level values for each control factor is in a corresponding range of second acceptance/reject criterion. Note that different upper and lower limits for each control factor may be set as second acceptance/reject criteria.

When determining that the control factors include a control factor whose one or more corresponding sensitivity values are out of the respective ranges of second acceptance/reject criteria (Yes in Step S1201), the controller 25 determines whether or not the repeat frequency matches the predetermined number of times (Step S1101). When determining the repeat frequency does not match the predetermined number of times (No in Step S1101), the controller changes a mode thereof to the recipe creating mode to generate combination information again (combination information generating step S802). When repeatedly generating combination information, the controller 25 changes one or more level values for each control factor in each of which it is determined that one or more corresponding sensitivity values are out of the respective ranges of second acceptance/reject criteria.

In contrast, when determining that the control factors include no control factor whose one or more corresponding sensitivity values are out of the respective ranges of second acceptance/reject criteria (No in Step S1201), the controller 25 determines, as an optimal value, a level value with the largest SN ratio among one or more corresponding level values for each control factor (level value determining step S816). The controller 25 causes the display section 21 to display the optimal value. The flow chart depicted in FIG. 13 then ends.

[When Acceptance/Reject Criteria for SN Ratios and Acceptance/Reject Criteria for Sensitivity Values are Set]

When first acceptance/reject criteria and second acceptance/reject criteria are set for each of control factors, the controller 25 determines whether or not the control factors include a control factor whose one or more corresponding SN ratios are out of respective ranges of first acceptance/reject criteria, or a control factor whose one or more corresponding sensitivity values are out of respective ranges of second acceptance/reject criteria (Step S1201). In the description below, a control factor whose one or more corresponding SN ratios are out of the respective ranges of first acceptance/reject criteria, or a control factor whose one or more corresponding sensitivity values are out of the respective ranges of second acceptance/reject criteria may be referred to "control factor whose one or more corresponding SN ratios or sensitivity values are out of respective ranges of acceptance/reject criteria".

When determining that the control factors include a control factor whose one or more corresponding SN ratios or sensitivity values are out of respective ranges of acceptance/reject criteria (Yes in Step S1201), the controller 25 determines whether or not the repeat frequency matches the predetermined number of times (Step S1101). When determining that the repeat frequency does not match the predetermined number of times (No in Step S1101), the controller 25 changes a mode thereof to the recipe creating mode to generate combination information again (combination information generating step S802). When repeatedly generating combination information, the controller 25 changes one or more level values for each control factor in each of which it is determined that one or more corresponding SN ratios or sensitivity values are out of the respective ranges of acceptance/reject criteria.

In contrast, when determining that the control factors include no control factor whose one or more corresponding SN ratios or sensitivity values are out of the respective ranges of acceptance/reject criteria (No in Step S1201), the controller 25 determines, as an optimal value, a level value of the largest SN ratio among one or more corresponding level values for each control factor (level value determining step S816). The controller 25 then causes the display section to display the optimal value. The flow chart depicted in FIG. 13 then ends.

[Step S1202]

In the present embodiment, the display section 21 functions as an alarm notification section. When determining that the repeat frequency matches the predetermined number of times (Yes in Step S1101), the controller 25 causes the display section 21 to display an on-screen alarm (Step S1202). An alarm is consequently given to the operator, and the flow chart depicted in FIG. 13 then ends. For example, the on-screen alarm indicates that no level value whose SN value and/or sensitivity value is in a corresponding range of acceptance/reject criterion could be acquired.

The third embodiment of the present invention has been described above. In the present embodiment, an operation device 2 (controller 25) searches level values in each of which a corresponding SN ratio and/or sensitivity value is in a corresponding range of acceptance/reject criterion. This enables reduction in the burden on the operator.

Note that although the display section 21 is employed as the alarm notification section in the present embodiment, the alarm notification section is not limited to the display section 21. For example, the operation device 2 may include a speaker. In this case, the speaker may be employed as the alarm notification section. Specifically, when determining that the repeat frequency matches the predetermined number of times (Yes in Step S1101), the controller causes the speaker to emit an alarm sound. Alternatively, the controller 25 may cause the speaker to emit an audio sound indicating that no level value whose SN ratio and/or sensitivity value is in the corresponding range of acceptance/reject criterion could be acquired.

The embodiments of the present invention have been described above with reference to the drawings. However, the present invention is not limited to the above embodiments and may be implemented in various manners within a scope not departing from the gist of the present invention.

For example, although the embodiments of the present invention describe the configuration in which the communication medium for transmitting the pieces of inspection result data to the operation device 2 is the communication cable 4, the communication medium for transmitting the pieces of inspection result data to the operation device 2 may be wireless communication.

Although the embodiments of the present invention describe the configuration in which the pieces of inspection result data are entered in the operation device 2 via the communication medium, the present invention may be applied to a configuration in which the pieces of inspection result data are entered in the operation device 2 by using a medium that holds data. Examples of the medium that holds data include an optical disc such as a compact disc and DVD, and storage such as USB memory.

Although the embodiments of the present invention describe the substrate 11 of semiconductor wafer, the substrate 11 is not limited to the semiconductor wafer. Examples of the substrate 11 may further include a glass substrate for photomask, a glass substrate for liquid-crystal display, a substrate for flat panel display such as organic EL display, a substrate for optical disk, a substrate for magnetic disk, and a substrate for magneto-optical disk.

Although the operation device 2 in the embodiments of the present invention includes an evaluation recipe creating function and a function for controlling the substrate processing device 1 based on the evaluation recipes, the operation device 2 may include, of the evaluation recipe creating function and the function for controlling the substrate processing device 1 based on the evaluation recipes, only the latter. In this case, the parameter design assistance system 10 further includes an information processing device that includes an evaluation recipe creating function, and the operation device 2 controls the substrate processing device 1 based on the evaluation recipes created by the information processing device. The information processing device is typically a general-purpose computer.

INDUSTRIAL APPLICABILITY

The present invention is useful for a parameter design of a substrate processing device.

REFERENCE SIGNS LIST

1 Substrate processing device
2 Operation device
3 Inspection device
10 Parameter design assistance system
11 Substrate
21 Display section
22 Input section
23 Connection section
24 Storage
25 Controller

The invention claimed is:

1. A parameter design assistance device, comprising:
storage that stores therein a standard recipe for controlling a substrate processing device that processes a substrate, the standard recipe indicating a standard value of each of parameters required to operate the substrate processing device; and
a controller configured to acquire one or more level values for each of control factors, wherein
the standard recipe includes a parameter of the parameters corresponding to at least one control factor of the control factors,
the level values indicate conditions according to which the substrate processing device is to process a substrate, and
the controller
generates, through statistical technique, combination information representing combinations of the level values acquired,
creates an evaluation recipe for each of the combinations of the level values based on the standard recipe and the combination information, the evaluation recipe indicating a parameter value of each of the parameters required to operate the substrate processing device, and
changes, in creation of the evaluation recipes, a standard value of the parameter corresponding to the at least one control factor included in the standard recipe to a level value of the at least one control factor for each of the combinations of the level values to create the evaluation recipes from the standard recipe.

2. The parameter design assistance device according to claim 1, wherein the statistical technique is a Taguchi method or an experimental design method.

3. The parameter design assistance device according to claim 2, wherein the controller allocates the level values acquired to an orthogonal array to generate the combination information.

4. The parameter design assistance device according to claim 1, comprising
an input section that allows an operator to operate, wherein
the input section allows the operator to enter the control factors to be registered therein.

5. The parameter design assistance device according to claim 1, wherein
the controller operates the substrate processing device based on each of the evaluation recipes.

6. The parameter design assistance device according to claim 5, comprising
an input section that allows an operator to operate, wherein
the input section allows the operator to enter a selection instruction therein, and
the selection instruction indicates whether or not to change a mode of the controller from a mode for creating the evaluation recipes to a mode for operating the substrate processing device.

7. The parameter design assistance device according to claim 5, wherein
the control factors include a non-recipe factor that cannot be controlled by a corresponding evaluation recipe, and
the controller suspends processing performed by the substrate processing device until the non-recipe factor reaches a corresponding level value.

8. The parameter design assistance device according to claim 7, comprising
an input section that allows an operator to operate, wherein
the input section allows the operator to enter a ready instruction therein, the ready instruction indicates that the non-recipe factor has reached the corresponding level value, and
the controller causes the substrate processing device to process the substrate after the ready instruction is entered in the input section.

9. The parameter design assistance device according to claim 5, wherein
the control factors include a stand-by factor corresponding to a parameter that needs to wait until a parameter value thereof stabilizes, and
the controller suspends processing performed by the substrate processing device until the stand-by factor stabilizes at a corresponding level value.

10. The parameter design assistance device according to claim 1, wherein
the controller repeats generation of the combination information and creation of the evaluation recipe, and
the controller changes one or more level values of at least one of the control factors when second combination information and subsequent respective pieces of combination information are generated.

11. The parameter design assistance device according to claim 10, comprising
an input section that allows an operator to operate, wherein
the input section allows the operator to enter a level value range to be registered for each of the control factors therein,
the controller acquires, when acquiring the one or more level values, one or more values included in the level value range,
the controller acquires, as the one or more level values of at least one of the control factors, one or more values different from one or more previous values from the level value range when the second combination information and the subsequent respective pieces of combination information are generated.

12. The parameter design assistance device according to claim 10, wherein
the controller
calculates, of respective SN ratios and sensitivity values of the level values for the control factors, at least the SN ratios based on an inspection result of the substrate processed by the substrate processing device,
determines whether or not the control factors include a control factor whose one or more corresponding SN ratios and/or sensitivity values are out of respective ranges of acceptance/reject criteria, and
finish repeating the generation of the combination information and the creation of the evaluation recipe when determining that the control factors include no control factor whose one or more corresponding SN ratios and/or sensitivity values are out of the respective ranges of acceptance/reject criteria.

13. The parameter design assistance device according to claim 12, comprising
an alarm notification section configured to raise alarm, wherein
the alarm notification section raises alarm when the control factors include the control factor whose one or more corresponding SN ratios and/or sensitivity values are out of the respective ranges of acceptance/reject criteria even if a number of times the generation of the combination information and the creation of the evaluation recipe are repeated reaches a predetermined number of times.

14. A parameter design assistance method, comprising:
a combination information generating step of acquiring, by a controller, one or more level values for each of control factors to generate, through statistical technique, combination information representing combinations of the level values acquired; and
an evaluation recipe creating step of creating, by the controller, an evaluation recipe for each of the combinations of the level values based on the combination information and a standard recipe for controlling a substrate processing device that processes a substrate, the standard recipe indicating a standard value of each of parameters required to operate the substrate processing device, the evaluation recipe indicating a parameter value of each of the parameters required to operate the substrate processing device, wherein
the standard recipe includes a parameter of the parameters corresponding to at least one control factor of the control factors,
the level values indicate conditions according to which the substrate processing device is to process a substrate, and
in the evaluation recipe creating step, the controller changes a standard value of the parameter corresponding to the at least one control factor included in the standard recipe to a level value of the at least one control factor for each of the combinations of the level values to create the evaluation recipes from the standard recipe.

15. The parameter design assistance method according to claim 14, wherein
the statistical technique is a Taguchi method or an experimental design method.

16. The parameter design assistance method according to claim 15, wherein
in the combination information generating step, the controller allocates the level values acquired to an orthogonal array to generate the combination information.

17. The parameter design assistance method according to claim 14, wherein
in the combination information generating step, an input section receives the control factors to be registered.

18. The parameter design assistance method according to claim 14, further comprising
a processing step of operating, by the controller, the substrate processing device based on each of the evaluation recipes.

19. The parameter design assistance method according to claim 18, comprising
a step of receiving, by an input section, a selection instruction, wherein
the selection instruction indicates whether or not to change a mode of the controller from a mode for creating the evaluation recipes to a mode for operating the substrate processing device.

20. The parameter design assistance method according to claim 18, wherein the control factors include a non-recipe factor that cannot be controlled by a corresponding evaluation recipe, and
in the processing step, the controller suspends processing performed by the substrate processing device until the non-recipe factor reaches a corresponding level value.

21. The parameter design assistance method according to claim 20, wherein
the processing step includes a step of receiving, by an input section, a ready instruction,
the ready instruction indicates that the non-recipe factor has reached the corresponding level value, and
the controller causes the substrate processing device to process the substrate after the ready instruction is entered in the input section.

22. The parameter design assistance method according to claim 18, wherein
the control factors include a stand-by factor corresponding to a parameter that needs to wait until a parameter value thereof stabilizes, and
in the processing step, the controller suspends processing performed by the substrate processing device until the stand-by factor stabilizes at a corresponding level value.

23. The parameter design assistance method according to claim 14, wherein
the combination information generating step and the evaluation recipe creating step are repeated, and
in a second combination information generating step and subsequent respective combination information generating steps, the controller changes one or more level values of at least one of the control factors.

24. The parameter design assistance method according to claim 23, wherein in the combination information generating step,
an input section receives a level value range for each of the control factors,
the controller acquires, when acquiring the one or more level values, one or more values included in the level value range, and
in a second combination information generating step and subsequent respective combination information generating steps, the controller acquires, as the one or more level values of at least one of the control factors, one or more values different from one or more previous values from the level value range.

25. The parameter design assistance method according to claim 23, comprising
- a calculating step of calculating, by the controller, of respective SN ratios and sensitivity values of the level values for the control factors, at least the SN ratios based on an inspection result of the substrate processed by the substrate processing device, and
- a step of determining, by the controller, whether or not the control factors include a control factor whose one or more corresponding SN ratios and/or sensitivity values calculated in the calculating step are out of respective ranges of acceptance/reject criteria, wherein
- the repetition of the combination information generating step and the evaluation recipe creating step ends when the controller determines that the control factors include no control factor whose one or more corresponding SN ratios and/or sensitivity values are out of the respective ranges of acceptance/reject criteria.

26. The parameter design assistance method according to claim 25, further comprising
- a step of raising, by an alarm notification section, alarm when the controller determines that the control factors include the control factor whose one or more corresponding SN ratios and/or sensitivity values are out of the respective ranges of acceptance/reject criteria even if a number of times the combination information generating step and the evaluation recipe creating step are repeated reaches a predetermined number of times.

* * * * *